United States Patent
McElrea et al.

(10) Patent No.: US 8,723,332 B2
(45) Date of Patent: May 13, 2014

(54) ELECTRICALLY INTERCONNECTED STACKED DIE ASSEMBLIES

(75) Inventors: Simon J. S. McElrea, Scotts Valley, CA (US); Lawrence Douglas Andrews, Jr., Los Gatos, CA (US); Scott McGrath, Scotts Valley, CA (US); Terrence Caskey, Santa Cruz, CA (US); Scott Jay Crane, Aromas, CA (US); Marc E. Robinson, San Jose, CA (US); Loreto Cantillep, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 974 days.

(21) Appl. No.: 12/124,077

(22) Filed: May 20, 2008

(65) Prior Publication Data

US 2008/0303131 A1     Dec. 11, 2008

Related U.S. Application Data

(60) Provisional application No. 60/970,903, filed on Sep. 7, 2007, provisional application No. 60/943,252, filed on Jun. 11, 2007, provisional application No. 60/981,457, filed on Oct. 19, 2007.

(51) Int. Cl.
    *H01L 23/48*         (2006.01)
(52) U.S. Cl.
    USPC ..................................................... 257/777
(58) Field of Classification Search
    USPC ......... 257/686, 685, 778, 777, 779–782, 784, 257/E23.001
    See application file for complete search history.

(56) References Cited

U.S. PATENT DOCUMENTS

| | | |
|---|---|---|
| 4,323,914 A | 4/1982 | Berndlmaier et al. |
| 4,336,551 A | 6/1982 | Fujita et al. |
| 4,363,076 A | 12/1982 | McIver |
| 4,500,905 A | 2/1985 | Shibata |
| 4,784,972 A | 11/1988 | Hatada |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,311,401 A | 5/1994 | Gates, Jr. et al. |
| 5,331,591 A | 7/1994 | Clifton |

(Continued)

FOREIGN PATENT DOCUMENTS

| | | |
|---|---|---|
| DE | 102004039906 A1 | 8/2005 |
| EP | 1041624 A1 | 10/2000 |

(Continued)

OTHER PUBLICATIONS

International Search Report for PCT Application No. PCT/US2008/065793, mailed Dec. 22, 2008.

(Continued)

*Primary Examiner* — Hoa B Trinh
(74) *Attorney, Agent, or Firm* — Lerner, David, Littenberg, Krumholz & Mentlik, LLP

(57) ABSTRACT

In die stack assembly configurations successive die in the stack are offset at a die edge at which die pads are situated, and the die are interconnected by electrically conductive traces. In some embodiments the electrically conductive traces are formed of an electrically conductive polymer. An electrically insulative conformal coating is provided having openings at die pads that are electrically connected.

38 Claims, 20 Drawing Sheets

(56) References Cited

U.S. PATENT DOCUMENTS

| | | |
|---|---|---|
| 5,334,872 A | 8/1994 | Ueda et al. |
| 5,434,745 A | 7/1995 | Shokrgozar et al. |
| 5,466,634 A | 11/1995 | Beilstein, Jr. et al. |
| 5,538,758 A | 7/1996 | Beach et al. |
| 5,571,754 A | 11/1996 | Bertin et al. |
| 5,616,953 A | 4/1997 | King et al. |
| 5,629,566 A | 5/1997 | Doi et al. |
| 5,691,248 A | 11/1997 | Cronin et al. |
| 5,698,895 A | 12/1997 | Pedersen et al. |
| 5,721,151 A | 2/1998 | Padmanabhan et al. |
| 5,731,631 A | 3/1998 | Yama et al. |
| 5,737,191 A | 4/1998 | Horiuchi et al. |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,030,854 A | 2/2000 | Mashimoto et al. |
| 6,034,438 A | 3/2000 | Petersen |
| 6,087,716 A | 7/2000 | Ikeda |
| 6,107,164 A | 8/2000 | Ohuchi |
| 6,175,158 B1 | 1/2001 | Degani et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,326,244 B1 | 12/2001 | Brooks et al. |
| 6,326,689 B1 | 12/2001 | Thomas |
| 6,338,980 B1 | 1/2002 | Satoh |
| 6,351,030 B2 | 2/2002 | Havens et al. |
| 6,472,746 B2 | 10/2002 | Taniguchi et al. |
| 6,476,467 B2 | 11/2002 | Nakamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,355,274 B2 | 4/2008 | Lim |
| 7,405,138 B2 | 7/2008 | Ohuchi et al. |
| 7,408,243 B2 | 8/2008 | Shiffer |
| 7,452,743 B2 | 11/2008 | Oliver et al. |
| 7,514,350 B2 | 4/2009 | Hashimoto |
| 7,521,288 B2 * | 4/2009 | Arai et al. .................. 438/109 |
| 7,535,109 B2 | 5/2009 | Robinson et al. |
| 7,564,142 B2 | 7/2009 | Hashimoto |
| 7,595,222 B2 | 9/2009 | Shimoishizaka et al. |
| 7,601,039 B2 | 10/2009 | Eldridge et al. |
| 7,638,869 B2 | 12/2009 | Irsigler et al. |
| 7,662,670 B2 | 2/2010 | Noma et al. |
| 7,704,794 B2 * | 4/2010 | Mess et al. .................. 438/112 |
| 7,732,912 B2 | 6/2010 | Damberg |
| 7,768,795 B2 | 8/2010 | Sakurai et al. |
| 7,829,438 B2 | 11/2010 | Haba et al. |
| 7,888,185 B2 | 2/2011 | Corisis et al. |
| 7,901,989 B2 | 3/2011 | Haba et al. |
| 7,919,846 B2 | 4/2011 | Hembree |
| 7,952,195 B2 * | 5/2011 | Haba ........................... 257/724 |
| 8,022,527 B2 | 9/2011 | Haba et al. |
| 8,076,788 B2 | 12/2011 | Haba et al. |
| 2001/0012725 A1 | 8/2001 | Maeda et al. |
| 2001/0031548 A1 | 10/2001 | Elenius et al. |
| 2002/0006686 A1 | 1/2002 | Cloud et al. |
| 2002/0027257 A1 | 3/2002 | Kinsman et al. |
| 2002/0045290 A1 | 4/2002 | Ball |
| 2002/0096349 A1 | 7/2002 | Hedler et al. |
| 2002/0127775 A1 | 9/2002 | Haba et al. |
| 2002/0168798 A1 | 11/2002 | Glenn et al. |
| 2002/0180010 A1 | 12/2002 | Tsubosaki et al. |
| 2002/0185725 A1 | 12/2002 | Moden et al. |
| 2002/0187260 A1 | 12/2002 | Sheppard et al. |
| 2003/0038353 A1 | 2/2003 | Derderian |
| 2003/0038356 A1 | 2/2003 | Derderian |
| 2003/0038357 A1 | 2/2003 | Derderian |
| 2003/0060034 A1 | 3/2003 | Beyne et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |
| 2003/0096454 A1 | 5/2003 | Poo et al. |
| 2003/0099085 A1 | 5/2003 | Duva |
| 2003/0122243 A1 | 7/2003 | Lee et al. |
| 2003/0209772 A1 | 11/2003 | Prabhu |
| 2004/0113283 A1 | 6/2004 | Farnworth et al. |
| 2004/0142509 A1 | 7/2004 | Imai |
| 2004/0150095 A1 | 8/2004 | Fraley et al. |
| 2004/0195667 A1 | 10/2004 | Karnezos |
| 2004/0198033 A1 | 10/2004 | Lee et al. |
| 2004/0212083 A1 | 10/2004 | Yang |
| 2004/0217446 A1 | 11/2004 | Headley et al. |
| 2004/0238933 A1 | 12/2004 | Chen et al. |
| 2004/0251520 A1 | 12/2004 | Sasaki et al. |
| 2004/0262035 A1 | 12/2004 | Ko et al. |
| 2005/0013927 A1 | 1/2005 | Yamazaki |
| 2005/0067680 A1 | 3/2005 | Boon et al. |
| 2005/0067694 A1 | 3/2005 | Pon et al. |
| 2005/0082651 A1 | 4/2005 | Farnworth et al. |
| 2005/0085050 A1 | 4/2005 | Draney et al. |
| 2005/0101039 A1 | 5/2005 | Chen et al. |
| 2005/0104179 A1 | 5/2005 | Zilber et al. |
| 2005/0148160 A1 | 7/2005 | Farnworth et al. |
| 2005/0230802 A1 | 10/2005 | Vindasius et al. |
| 2005/0248021 A1 | 11/2005 | Morkner |
| 2005/0258530 A1 | 11/2005 | Vindasius et al. |
| 2005/0287705 A1 | 12/2005 | Yang |
| 2006/0003552 A1 | 1/2006 | Okada |
| 2006/0035408 A1 * | 2/2006 | Derderian .................. 438/106 |
| 2006/0055050 A1 | 3/2006 | Numata et al. |
| 2006/0068567 A1 | 3/2006 | Beyne et al. |

(56) References Cited

U.S. PATENT DOCUMENTS

| | | | |
|---|---|---|---|
| 2006/0076690 A1* | 4/2006 | Khandros et al. | 257/777 |
| 2006/0094165 A1 | 5/2006 | Hedler et al. | |
| 2006/0097356 A1 | 5/2006 | Fujii et al. | |
| 2006/0121645 A1 | 6/2006 | Ball | |
| 2006/0138626 A1 | 6/2006 | Liew et al. | |
| 2006/0220262 A1 | 10/2006 | Meyer et al. | |
| 2006/0267173 A1* | 11/2006 | Takiar et al. | 257/686 |
| 2006/0273365 A1 | 12/2006 | Cross et al. | |
| 2006/0278971 A1 | 12/2006 | Barnes et al. | |
| 2007/0065987 A1 | 3/2007 | Mess et al. | |
| 2007/0102801 A1 | 5/2007 | Ishida et al. | |
| 2007/0132082 A1 | 6/2007 | Tang et al. | |
| 2007/0158799 A1* | 7/2007 | Chiu et al. | 257/678 |
| 2007/0158807 A1 | 7/2007 | Lu et al. | |
| 2007/0170572 A1* | 7/2007 | Liu et al. | 257/686 |
| 2007/0181989 A1 | 8/2007 | Corisis et al. | |
| 2007/0194462 A1* | 8/2007 | Kim et al. | 257/787 |
| 2007/0222054 A1 | 9/2007 | Hembree | |
| 2007/0252262 A1 | 11/2007 | Robinson et al. | |
| 2007/0284716 A1 | 12/2007 | Vindasius et al. | |
| 2008/0083976 A1 | 4/2008 | Haba et al. | |
| 2008/0083977 A1 | 4/2008 | Haba et al. | |
| 2008/0112150 A1 | 5/2008 | Jones | |
| 2008/0166836 A1 | 7/2008 | Jobetto | |
| 2008/0173792 A1 | 7/2008 | Yang et al. | |
| 2008/0180242 A1 | 7/2008 | Cottingham | |
| 2008/0203566 A1 | 8/2008 | Su | |
| 2008/0206915 A1 | 8/2008 | Yamazaki | |
| 2008/0208043 A1 | 8/2008 | Smith et al. | |
| 2008/0251913 A1 | 10/2008 | Inomata | |
| 2008/0284044 A1 | 11/2008 | Myers | |
| 2008/0308921 A1 | 12/2008 | Kim | |
| 2009/0020889 A1 | 1/2009 | Murayama et al. | |
| 2009/0065948 A1 | 3/2009 | Wang | |
| 2009/0102038 A1 | 4/2009 | McElrea et al. | |
| 2009/0146137 A1 | 6/2009 | Kim et al. | |
| 2009/0160065 A1 | 6/2009 | Haba et al. | |
| 2009/0230528 A1 | 9/2009 | McElrea et al. | |
| 2009/0316378 A1 | 12/2009 | Haba et al. | |
| 2010/0140753 A1 | 6/2010 | Hembree | |
| 2010/0207277 A1 | 8/2010 | Bauer et al. | |
| 2011/0006432 A1 | 1/2011 | Haba et al. | |
| 2011/0031629 A1 | 2/2011 | Haba et al. | |
| 2011/0033979 A1 | 2/2011 | Haba et al. | |
| 2011/0049696 A1 | 3/2011 | Haba et al. | |
| 2011/0187007 A1 | 8/2011 | Haba et al. | |
| 2011/0248410 A1 | 10/2011 | Avsian et al. | |
| 2012/0061846 A1 | 3/2012 | Rathburn | |
| 2012/0080807 A1 | 4/2012 | Haba et al. | |
| 2012/0133057 A1 | 5/2012 | Haba et al. | |
| 2013/0099392 A1 | 4/2013 | McElrea et al. | |

FOREIGN PATENT DOCUMENTS

| | | |
|---|---|---|
| EP | 1 763 894 A A2 | 3/2007 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004-119473 | 4/2004 |
| JP | 2004153130 A | 5/2004 |
| JP | 2004158536 A | 6/2004 |
| JP | 2004-214548 | 7/2004 |
| JP | 2005005529 A | 1/2005 |
| JP | 2006-351793 A | 12/2006 |
| JP | 2009-026969 | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005101492 A2 | 10/2005 |
| WO | 2009052150 A1 | 4/2009 |
| WO | 2009114670 A2 | 9/2009 |

OTHER PUBLICATIONS

International Search Report for PCT Application No. PCT/US2008/065788, mailed Sep. 30, 2008.
International Search Report & Written Opinion, Application No. PCT/US2008.066561, dated Dec. 31, 2008.
Amendment filed Jul. 26, 2010 in response to May 24, 2010 Office Action, U.S. Appl. No. 12/124,097.
EP Supplementary Search Report mailed Jun. 12, 2008, EP App. No. 05735136.3.
Final Office Action mailed Jul 1, 2010, U.S. Appl. No. 11/744,153.
Notice of Allowance mailed Feb. 27, 2009, U.S. Appl. No. 11/744,153.
Amendment filed Jul. 30, 2009 in response to Dec. 30, 2009 Office Action, U.S. Appl. No. 12/143,157.
International Search Report and Written Opinion, Appl. No. PCT/US2008/067722, dated Feb. 25, 2009.
Final Office Action mailed Mar. 2, 2011, U.S. Appl. No. 12/251,624.
International Search Report and Written Opinion dated Mar. 17, 2009, App. No. PCT/US2008/079948.
International Search Report and Written Opinion dated Mar. 6, 2009, App. No. PCT/US2008/73365.
International Search Report and Written Opinion dated Oct. 6, 2009, App. No. PCT/US2009/36921.
International Search Report and Written Opinion dated Apr. 12, 2010, App. No. PCT/US2009/55421.
International Search Report and Written Opinion dated Jan. 26, 2011, App. No. PCT/US2010/39639.
Final Office Action, mailed Aug. 5, 2010, U.S. Appl. No. 12/143,157.
International Search Report and Written Opinion for Application No. PCT/US2009/047389 dated Jan. 14, 2010.
International Search Report for Application No. PCT/US2009/067386 dated Jul. 1, 2010.
International Search Report for Application No. PCT/US2010/039639 dated Jan. 26, 2011.
International Search Report for Application No. PCT/US2010/055472 dated Jul. 27, 2011.
International Search Report mailed Mar. 23, 2009, International Application No. PCT/US2008/74450.
Ko, et al., Development of three-dimensional memory die stack packages using polymer insulated sidewall technique, 1999.
Notice of Allowability, mailed Oct. 19, 2006, U.S. Appl. No. 11/090,969.
Notice of Allowability, mailed Oct. 19, 2006 U.S. Appl. No. 11/090,969.
Notice of Allowance mailed Dec. 17, 2009, U.S. Appl. No. 11/016,558.
Notice of Allowance mailed Feb. 27, 2009, U.S. Appl. No. 11/744,153.
Notice of Allowance, mailed Feb. 12, 2007, U.S. Appl. No. 11/097,829.
Notice of Appeal filed Sep. 16, 2010 in response to Mar. 18, 2010 Office Action, U.S. Appl. No. 11/744,142.
Notice to File Corrected Papers, mailed Mar. 30, 2007, U.S. Appl. No. 11/097,829.
Office Action (Restriction) mailed Jan. 21, 2010, U.S. Appl. No. 12/046,651.
Office Action (Restriction) mailed Oct. 7, 2009, U.S. Appl. No. 11/849,162.
Office Action (Restriction) mailed Jun. 24, 2009, U.S. Appl. No. 11/849,162.
Office Action (Restriction) mailed Apr. 20, 2009, U.S. Appl. No. 11/744,142.

(56) References Cited

OTHER PUBLICATIONS

Office Action (Restriction) mailed Dec. 28, 2010, U.S. Appl. No. 12/403,175.
Office Action (Restriction) mailed Feb. 4, 2010, U.S. Appl. No. 12/251,624.
Office Action (Restriction) mailed May 24, 2010, U.S. Appl. No. 12/124,097.
Office Action (Restriction) mailed Oct. 7, 2009, U.S. Appl. No. 12/143,157.
Office Action mailed Jan. 27, 2009, U.S. Appl. No. 11/849,162.
Office Action mailed Dec. 15, 2008, U.S. Appl. No. 11/016,558.
Office Action mailed Dec. 22, 2006, U.S. Appl. No. 11/016,558.
Office Action mailed Dec. 31, 2007, U.S. Appl. No. 11/744,153.
Office Action mailed Feb. 7, 2006, U.S. Appl. No. 11/097,829.
Office Action mailed Mar. 19, 2008, EP Application No. 05736129.7.
Office Action mailed Mar. 27, 2008, U.S. Appl. No. 11/016,558.
Office Action mailed Jul. 15, 2009, U.S. Appl. No. 11/016,558.
Office Action mailed Jul. 21, 2010 U.S. Appl. No. 11/849,162.
Office Action mailed Aug. 18, 2010, App. No. 12/046,651.
Office Action mailed Aug. 3, 2009, U.S. Appl. No. 11/744,142.
Office Action mailed Dec. 30, 2009, U.S. Appl. No. 12/143,157.
Office Action mailed Jun. 9, 2010, U.S. Appl. No. 12/251,624.
Office Action mailed Mar. 1, 2011, U.S. Appl. No. 12/143,157.
Office Action mailed Oct. 14, 2010, U.S. Appl. No. 12/124,097.
Response filed Oct. 19, 2007 to Oct. 10, 2007 Advisory Action, U.S. Appl. No. 11/016,558.
Response filed Aug. 5, 2009 in response to Jul. 15, 2009 Office Action, U.S. Appl. No. 11/016,558.
Supplemental Amendement filed Aug. 5, 2009, App. No. 111849,162.
U.S. Appl. No. 12/124,097, filed May 20, 2008.
Written Opinion of the International Searching Authority for Application No. No. PCT/US2010/055472 dated Jul. 27, 2011.
Written Opinion of the International Searching Authority for Application No. PCT/US2009/067386 dated Jul. 1, 2010.
Written Opinion of the International Searching Authority for Application No. PCT/US2010/039639 dated Jan. 26, 2011.
Advisory Action mailed Oct. 10, 2007, U.S. Appl. No. 11/016,558.
Advisory Action, mailed Oct. 20, 2008, App. No. 111744,153.
Advisory Action, mailed Oct. 20, 2008, U.S. Appl. No. 11/744,153.
Amendment A filed Aug. 7, 2006 in response to Feb. 7, 2006 Office Action, U.S. Appl. No. 11/097,829.
Amendment A filed Aug. 7, 2006 in response to Feb. 7, 2006 Quayle Action, U.S. Appl. No. 11/090,969.
Amendment and RCE filed Nov. 26, 2008 in response to Oct. 20, 2008 Advisory Action, U.S. Appl. No. 11/744,153.
Amendment and RCE filed Mar. 16, 2011 in response to Mar. 18, 2010 Office Action, U.S. Appl. No. 11/744,142.
Amendment and RCE filed Feb. 7, 2011 in repsonse to Aug. 5, 2010 Office Action, U.S. Appl. No. 12/143,157.
Amendment filed Jan. 18, 2011 in response to Aug. 18, 2010 Office Action, U.S. Appl. No. 12/046,651.
Amendment filed Jan. 21, 2011 in response to Jul. 21, 2010 Office Action, U.S Appl. No. 11/849,162.
Amendment filed Jan. 22, 2007 in response to Jul. 19, 2007 Office Action, U.S. Appl. No. 11/016,558.
Amendment filed Oct. 1, 2008 in response to Jul. 1, 2010 Office Action, U.S. Appl. No. 11/744,153.
Amendment filed Oct. 14, 2008 in response to Sep. 15, 2008 Office Action, U.S. Appl. No. 11/016,558.
Amendment filed Nov. 9, 2009 in response to Oct. 7, 2009 Office Action, U.S. Appl. No. 11/849,162.
Amendment filed Dec. 3, 2009 in response to Aug. 3, 2009 Office Action, U.S. Appl. No. 11/744,142.
Amendment filed Feb. 22, 2010 in response to Feb. 21, 2010 Office Action, U.S. Appl. No. 12/046,651.
Amendment filed Mar. 27, 2009 in response to Jan. 27, 2009 Office Action, U.S. Appl. No. 11/849,162.
Amendment filed Apr. 1, 2008 in response to Dec. 31, 2007 Office Action , U.S. Appl. No. 11/744,153.
Amendment filed Apr. 8, 2009 in response to Dec. 15, 2008 Office Action, U.S. Appl. No. 11/016,558.
Amendment filed Jun. 21, 2007 in response to Dec. 22, 2006 Office Action, U.S. Appl. No. 11/016,558.
Amendment filed Jun. 27, 2008 in response to Mar. 27, 2008 Office Action, U.S. Appl. No. 11/016,558.
Amendment filed Jul. 8, 2009 in response to Jun. 24, 2009 Office Action, U.S. Appl. No. 11/849,162.
Amendment filed Sep. 19, 2007 in response to Jul. 19, 2007 Office Action, U.S. Appl. No. 11/016,558.
Amendment filed Apr. 11, 2008 in response to Dec. 31, 2007 Office Action, U.S. Appl. No. 11/744,153.
Amendment filed Dec. 9, 2010 in response to Jun. 9, 2010 Office Action, U.S. Appl. No. 12/251,624.
Amendment filed Feb. 14, 2011 in response to Oct. 14, 2010 Office Action, U.S. Appl. No. 12/124,097.
Amendment filed Jan. 24, 2007 in response to Jan. 8, 2007 Office Action, U.S. Appl. No. 11/097,829.
Amendment filed Jan. 29, 2010 in response to Dec. 28, 2010 Office Action, U.S. Appl. No. 12/403,175.
Amendment filed Jun. 26, 2010 in response to May 24, 2010 Office Action, U.S. Appl. No. 12/124,097.
Amendment filed Jun. 30, 2009 in response to Dec. 30, 2009 Office Action, U.S. Appl. No. 12/143,157.
Amendment filed Mar. 4, 2010 in response to Feb. 4, 2010 Office Action, U.S. Appl. No. 12/251,624.
Amendment filed May 22, 2009 in response to Apr. 20, 2009 Office Action, U.S. Appl. No. 11/744,142.
Amendment filed May 29, 2007 in response to Mar. 30, 2007 Notice, U.S. Appl. No. 11/097,829.
Amendment filed Nov. 9, 2009 in response to Oct. 7, 2009 Office Action, U.S. Appl. No. 12/143,157.
EP Supplemental Search Report mailed Nov. 5, 2007, EP Application No. 05736129.7.
EP Supplementary Search Report mailed Jun. 5, 2008, EP App. No. 05735136.3.
Ex Parte Quayle Action mailed 217/06, U.S. Appl. No. 11/090,969.
Final Office Action mailed Mar. 18, 2010, U.S. Appl. No. 11/744,142.
Final Office Action mailed Jul. 1, 2010, U.S. Appl. No. 11/744,153.
Final Office Action mailed Jul. 19, 2007, U.S. Appl. No. 11/016,558.
Final Office Action mailed Sep. 15, 2008, U.S. Appl. No. 11/016,558.
Final Office Action mailed Jan. 8, 2007, U.S. Appl. No. 11/097,829.
Final Office Action mailed Mar. 1, 2011, U.S. Appl. No. 12/251,624.
International Search Report and Written Opinion for Application No. PCT/US2010/054325 dated Jul. 28, 2011.
Japanese Office Action for Application No. 2010-550853 dated Sep. 18, 2013.

* cited by examiner

ELECTRICALLY INTERCONNECTED STACKED DIE ASSEMBLIES

CROSS-REFERENCE TO RELATED APPLICATIONS

This application claims priority from U.S. Provisional Application No. 60/970,903, titled "Electrically interconnected stacked die assemblies," which was filed Sep. 7, 2007; and this application claims priority in part from U.S. Provisional Application No. 60/943,252, titled "Coinstack method for optimized integrated circuit chip interconnection," which was filed Jun. 11, 2007; and in part from U.S. Provisional Application No. 60/981,457, titled "Electrical interconnect formed by dot dispense," which was filed Oct. 19, 2007.

This application is related to U.S. application Ser. No. 12/124,097, titled "Electrical interconnect formed by pulsed dispense," which claims priority from U.S. Provisional Application No. 60/981,457 (cited above), and which is being filed on the same date as this application. The above-referenced applications are hereby incorporated herein by reference.

BACKGROUND

This invention relates to electrical interconnection of integrated circuit chips and, particularly, to interconnection of stacked die.

A typical semiconductor die has a front ("active") side, in which the integrated circuitry is formed, a back side, and sidewalls. The sidewalls meet the front side at front edges and the back side at back edges. Semiconductor die typically are provided with interconnect pads (die pads) located at the front side for electrical interconnection of the circuitry on the die with other circuitry in the device in which the die is deployed. Some die as provided have die pads on the front side along one or more of the die margins, and these may be referred to as peripheral pad die. Other die as provided have die pads arranged in one or two rows at the front side near the center of the die, and these may be referred to as central pad die. The die may be "rerouted" to provide a suitable arrangement of interconnect pads at or near one or more of the margins of the die.

Semiconductor die may be electrically connected with other circuitry, for example in a printed circuit board, a package substrate or leadframe, or another die, by any of several means. Connection may be made, for example, by wire bonds, or by flip chip interconnects, or by tab interconnects.

A number of approaches have been proposed for increasing the density of active semiconductor circuitry in integrated circuit chip packages, while minimizing package size (package footprint, package thickness). In one approach to making a high density package having a smaller footprint, two or more semiconductor die, of the same or different functionality, are stacked one over another and mounted on a package substrate.

Wire bond interconnect requires both vertical clearance over the die surface at the front side margin, to accommodate the wire loop height, and horizontal clearance outside the die footprint, to accommodate the wire span. If the vertical clearance is insufficient, overlying features may interfere with or introduce electrical shorting to the wire loops. And, in practice, the lower interconnect pad or bond site must be located some distance away from the sidewall of the overlying die, so that the wire bonding tool does not impact the die edge during the bonding process, and so that the wire bond does not contact the front edge of the die.

Electrical interconnection of stacked semiconductor die presents a number of challenges. For instance, two or more die in a stack may be mounted on a substrate with their front sides facing away from the substrate, and connected by wire bonds die-to-substrate or die-to-die. Die-to-die wire bond interconnect may be made where an upper die is dimensioned or located so that the upper die does not overlie the margin of the lower die to which it is connected, and so that sufficient horizontal clearance is provided for the wire span. This condition may pertain, for example, where the footprint of the upper die is sufficiently narrower than the lower die; or, for example, where the upper die is arranged so that the footprint of the upper die is offset in relation to the margin of the lower die. Alternatively, the die in the stack may be indirectly interconnected by connecting them to a common substrate on which the stack is mounted. Where a lower die in a stack is wire bonded die-to-substrate, and where the footprint of an upper die overlies the margin of the lower die, a spacer may be interposed to provide sufficient vertical clearance between the lower and the upper die to accommodate the wire loops over the lower die. The spacer adds to the thickness of the stack and, consequently, of the package. Moreover, in such a configuration the wire bond die-to-substrate connection of the lower die must be completed before the spacer and the upper die are stacked over it; that is, the die must be stacked in situ on the substrate and the die must be stacked and connected serially.

SUMMARY

In various general aspects the invention features die stack assembly configurations and interconnection means.

In some aspects two or more die are stacked one over another; adjacent die in the stack are provided with interconnect pads arranged at the front side along a die margin, and the edge at the margin of a first die is offset in relation to the margin of the second die; and interconnect pads on the die are electrically connected by traces of an electrically conductive polymer.

The offset reveals at least a fraction of the area of the interconnect pads on the lower die, so that the pads on the lower die are available for electrical connection with pads on a die situated above.

In some embodiments the die are provided with an electrical insulation over at least the portions of the die surfaces over which the conductive traces are situated. In some embodiments the die are provided with an electrical insulation over at least those one or more sidewalls adjacent the die margin or die margins on which the interconnect pads are arranged; in some such embodiments the die are additionally provided with an electrical insulation over the front surface adjacent the die margin or die margins on which the interconnect pads are arranged, and in some such embodiments the die are additionally provided with an electrical insulation over back surface; in some embodiments the die are provided with an electrical insulation over the front surface, the back surface, and the sidewall surfaces of the die.

In some such embodiments the electrical insulation includes an electrically insulative conformal coating. The conformal coating protects the die during assembly, and serves to electrically insulate the die from electrically conductive parts that it may contact. In some embodiments the material of the conformal coating includes a nonorganic polymer, such as for example a sol-gel glass deposit. In other embodiments the material of the conformal coating includes an organic polymer, such as for example a polyimid, a benzocyclobutene (BCB), an epoxy, or a cyanoacrylate; or a halogenated polymer such as for example a polymer of p-xylene or a derivative thereof, such as a polyxylylene polymer, e.g., a parylene C or a parylene N, or a parylene A, or a parylene SR. In some embodiments the conformal coating is formed by deposition, for example by vapor deposition, or liquid phase deposition, or by solid phase deposition.

Openings in the electrical insulation expose at least selected die pads or interconnect terminals. The openings may in some embodiments be made following formation of the insulation. For example where the electrical insulation includes a conformal coating, such as a parylene, openings may be made by removing spots of the conformal coating over the selected die pads. A laser may be used to effect targeted removal of the conformal coating. In embodiments where the openings are made following formation of the insulation, the openings can optionally be made following stacking the die.

The electrical insulation may be applied to the die prior to stacking; or, the electrical insulation may be applied to the stack of die after stacking; or, the electrical insulation may be applied to the die prior to stacking as well as to the stack.

In some embodiments the interconnect material is an electrically conductive polymer, such as a curable conductive epoxy, for example. In some embodiments the interconnect material is applied using an application tool such as, for example, a syringe or a nozzle or a needle. The material exits the tool in a deposition direction generally toward the die pads or interconnect terminals, and the tool is moved over the presented stack face in a work direction to form a trace. The material may be extruded from the tool in a continuous flow; or, the extrusion of the material may be pulsed; or, the flow may be interrupted by valving; or, the material may exit the tool dropwise. In some embodiments the material exits the tool as a jet of droplets, and is deposited as dots which coalesce upon contact, or following contact, with a stack face surface. Various modes of pulse dispense are described in U.S. application Ser. No. 12/124,097, cited above. In some embodiments the deposition direction is generally perpendicular to the die edge surface, and in other embodiments the deposition direction is at an angle off perpendicular to the die edge surface. The tool may be moved in a generally linear work direction, or in a zig-zag work direction, depending upon the location on the various die of the corresponding terminals to be connected. The trace may be branched or forked (for example, a "Y" trace), or unbranched.

In some embodiments the traces are formed one at a time. In some embodiments more than one interconnect trace is formed in a single interconnect operation, and in some such embodiments all the interconnect traces on a given stacked assembly are formed in a single operation (or in a number of operations fewer than the number of traces). The application tool may in such instances include a number of needles or nozzles ganged together in a row generally parallel to the die edges. In some embodiments interconnect traces between pairs of vertically adjacent die are made simultaneously, rather than serially, as suggested in FIGS. 4B, 5, and in some such embodiments all the interconnections along a "vertical" direction (for example, direction W in FIGS. 4B, 5, or a direction opposite direction W as shown) are made at once. In such instances the application tool may include a number of needles or nozzles ganged together in a column generally parallel to the interconnect tract direction W.

In some embodiments the interconnects are applied by printing, for example using a print head (which may have a suitable array of nozzles), or for example by screen printing or stencil printing, or using a mask. Printing may in some embodiments be carried out using a print head having an array of print nozzles, and the material may be ejected from the nozzles using a mechanism similar t an "ink jet" printing mechanism, employing for example piezoelectric or thermal bubble propulsion.

In another general aspect the invention features stacked die units or stacked die assemblies electrically interconnected with circuitry in a device for use. In some embodiments the stacked die assembly is interconnected such that the active side of the die faces toward the underlying circuitry; in other embodiments the stacked die assembly is interconnected such that the back side of the die faces toward the underlying circuitry; in some embodiments the stacked die assembly includes one or more die arranged so that the back side of the die faces toward the underlying circuitry, and one or more other die are arranged so that the active side of the die faces toward the underlying circuitry.

The stacked die units or stacked die assemblies may in various embodiments have various stacking configurations. In some embodiments, for example, each die has interconnect pads situated in a margin along at least a first die edge, and succeeding die in the stack may be arranged so that their respective first die edges face toward the same face of the stack. This configuration presents as a stairstep die stack, and the interconnections are made over the steps. In other embodiments, for example, each die has interconnect margins along at least a first die edge, but succeeding die in the stack are arranged so that their respective first die edges face toward a different (e.g., opposite) face of the stack. Where the first die edges face toward an opposite stack face, this configuration presents as a staggered die stack, where (numbering the die sequentially from the bottom of the stack) the first die edges of odd-numbered die face toward one stack face and the first dies edges of even-numbered die face toward the opposite stack face. In a staggered stack, the first die edges of the odd-numbered die are vertically aligned at one stack face, and corresponding over lying pads can be connected by a vertical interconnect; and the even-numbered die are vertically aligned at the opposite stack face, and corresponding overlying pads can be connected by another vertical interconnect. In the staggered stack configuration the even-numbered die act as spacers between the odd-numbered die, and the odd-numbered die act as spacers between the even-numbered die. Because the spaces between the die are comparatively high, (approximately the thickness of the interposed die), the interconnect traces are formed to traverse portions of the interconnect distance unsupported. In still other embodiments, for example, die having an X-dimension greater than a Y-dimension are stacked, with succeeding die in the stack oriented at 90° in relation to vertically adjacent die below or above. In such embodiments each die has interconnect pads situated in a margin along at least a first narrower die edge (typically along both narrower die edges), and (numbering the die sequentially from the bottom of the stack) the first die edge of the even-numbered die may face toward one face of the stack, and the first die edge of the odd-numbered die may face toward a second stack face, at 90° to the first stack face. In any of these embodiments each die may additionally have interconnect pads situated in a margin along a second die edge in addition to the first, and the second die edge may be an opposite edge or an adjacent (at 90°) die edge.

The assemblies according to the invention can be used in any electronic system, particularly in a small-format application such as a portable or hand-held device; for example the assemblies can be used for building computers such as personal computers, telecommunications equipment, and consumer and industrial electronics devices.

BRIEF DESCRIPTION OF THE DRAWINGS

FIG. 15B is a diagrammatic sketch in a partial sectional view of an 8-die offset stack, as indicated at 15B-15B in FIG. 15A, interconnected.

Figure 21A:
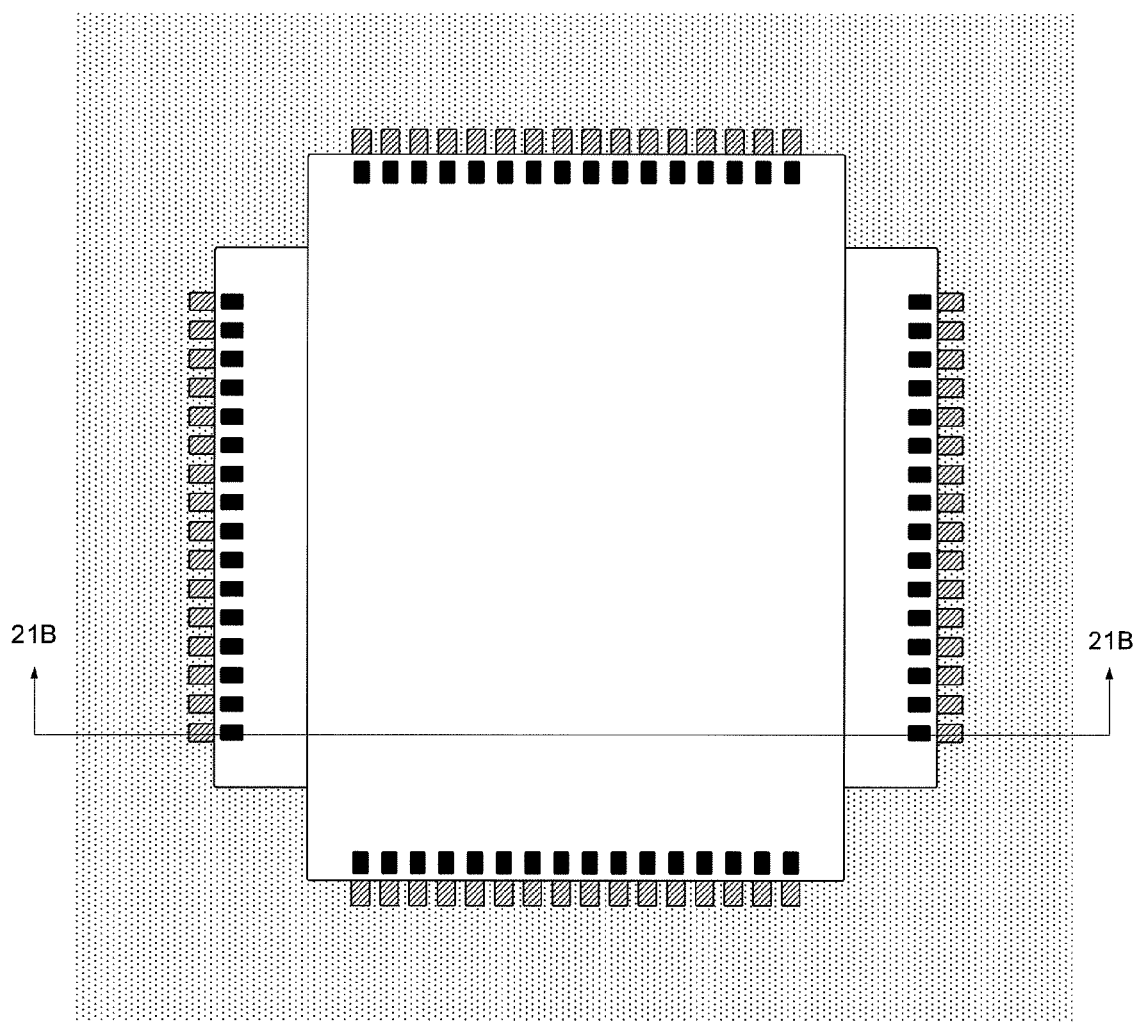
FIG. 21A is a diagrammatic sketch in a plan view showing a stack of die mounted on a substrate, according to another embodiment of the invention.

21C is a diagrammatic sketch showing another embodiment of an interconnected stacked die assembly as in FIG. 21A in an elevational view.

Figure 22:
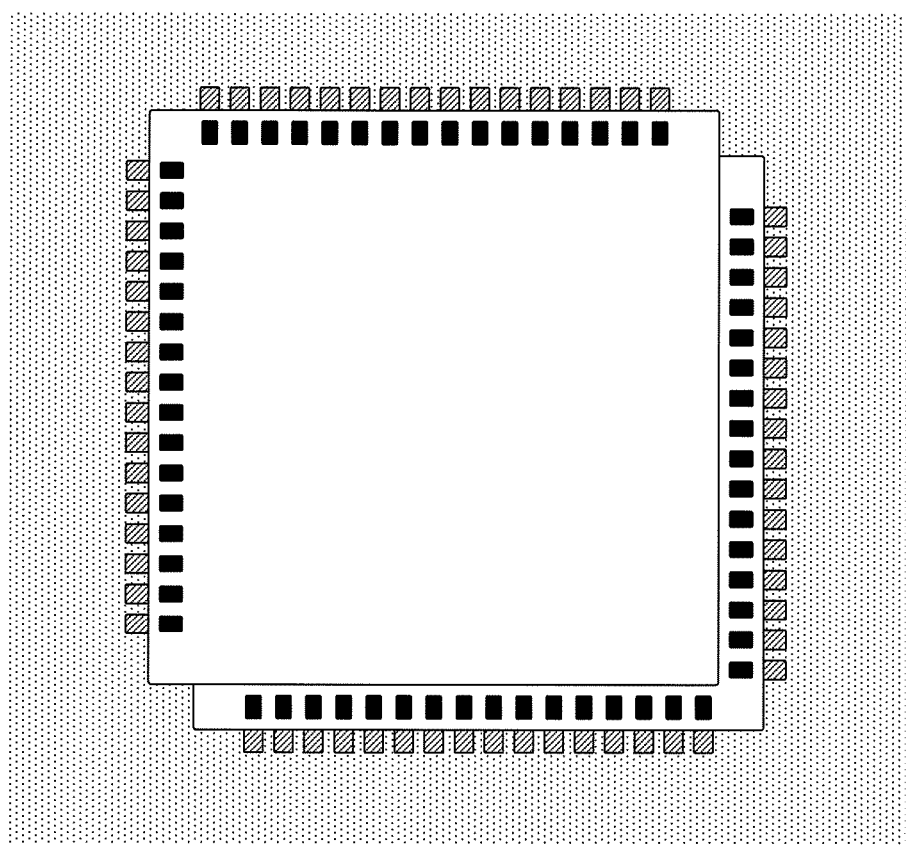

FIG. 22 is a diagrammatic sketch in a plan view showing a stack of die mounted on a substrate, according to another embodiment of the invention.

Figure 23A:
Figure 23B:
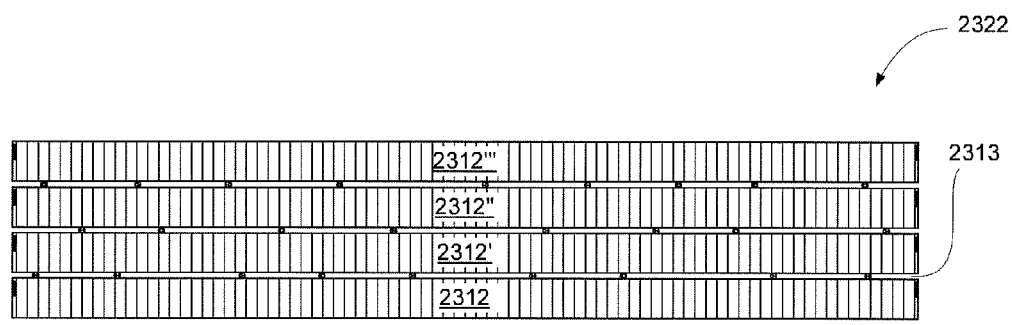
Figure 23C:
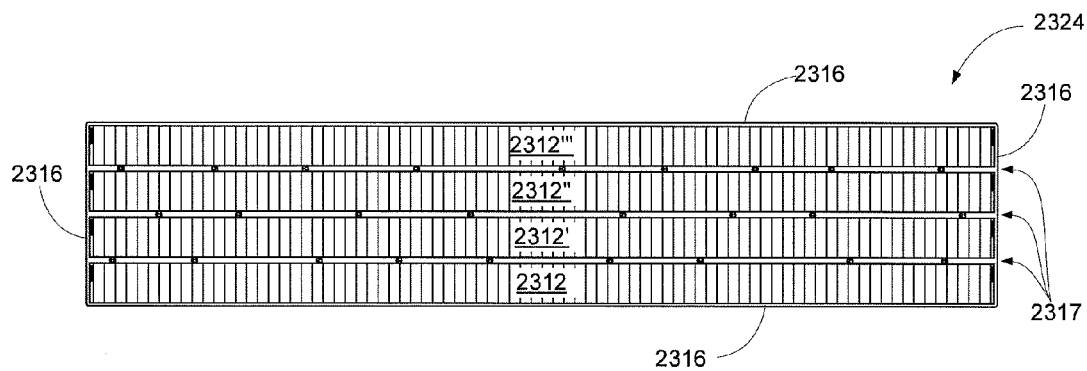

FIGS. 23A-23C are diagrammatic sketches in sectional view showing stages in construction of a conformally coated four die stack assembly according to an embodiment of the invention.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs. Also for clarity of presentation certain features are not shown in the FIGs., where not necessary for an understanding of the invention.

FIGS. 1A-1F show examples of various die edge configurations in die to be interconnected according to various embodiments of the invention.

Figure 1A:
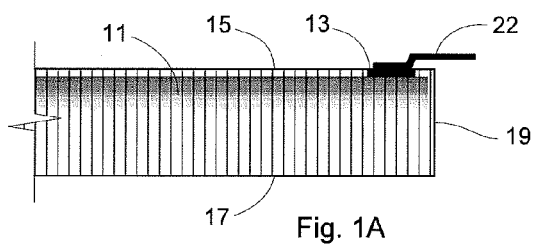
FIGS. 1A-1F are diagrammatic sketches in sectional view showing examples of various die edge configurations.

FIG. 1A shows a die having an "off-die" interconnect. The die is shown in a partial sectional view, having an active side 15 at which the integrated circuitry 11 of the die is formed, and a die sidewall 19. In an off die configuration an interconnect terminal 22 is bonded to an interconnect pad (die pad) 13. The die pad may be a peripheral die pad in the die as provided, or it may be situated at or near the die periphery as a result of rerouting of the die circuitry. The interconnect terminal may be, for example, a wire (formed for example in a wire bond operation) or a tab or ribbon (formed for example in a ribbon bond operation). The interconnect terminal 22 extends outwardly beyond the die edge 19 (hence, "off-die" terminal).

Figure 1B:
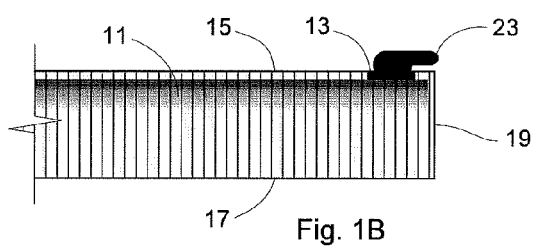

FIG. 1B shows a die having a bump or glob 23 of an electrically conductive polymer material deposited onto the die pad 13. The glob may be shaped (as in the example of FIGS. 1A, 1B, so that it extends toward the die edge, and may extend to the die edge or (as in the example shown) slightly beyond the die edge 19; it may be in the shape of a thumb, for example. Alternatively, the glob may be formed entirely above the pad, as shown in FIG. 3B. The conductive polymer material may be, for example, a curable conductive polymer such as a conductive epoxy.

Figure 1C:
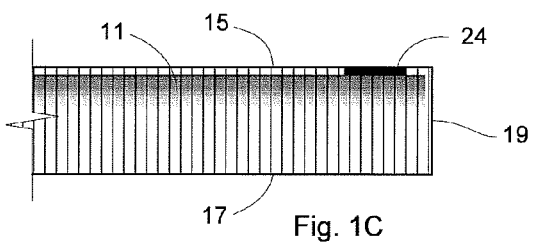

FIG. 1C shows a die having an interconnect terminal 24 formed in or at the active side of the die, at or near the margin of the die where the active side 15 of the die meets the die sidewall 19. Such an interconnect terminal at the margin may be an extension of a die pad, for example, and may be situated at or near the die margin as a result of rerouting of the die circuitry.

Figure 1D:
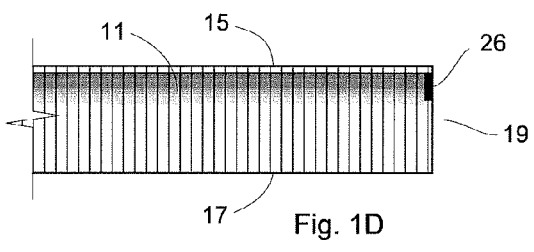

FIG. 1D shows a die having an interconnect terminal 26 formed in the die sidewall 19. The interconnect terminal may be connected to the integrated circuitry of the die by attachment of a pad of conductive material to an extension of the die pad, for example, or to rerouting circuitry.

Figure 1E:
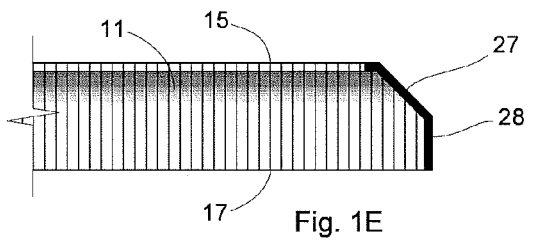

FIG. 1E shows a die having an interconnect terminal formed so that it wraps around a chamfer that is formed at the front side die edge (at the intersection of the die sidewall with active side 15 of the die). Such a wraparound terminal has a terminal portion 27 on the chamfer, and a terminal portion 28 on the die sidewall. A similar wraparound terminal may be formed over the back side die edge (at the intersection of the die sidewall with back side 17 of the die), where no chamfer is present.

Figure 1F:
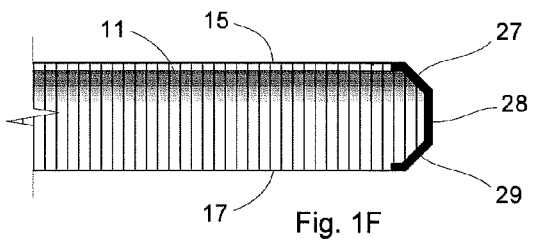

FIG. 1F shows a die having an interconnect terminal formed so that it wraps around a chamfer that is formed at the front side die edge (at the intersection of the die sidewall with active side 15 of the die), and further around a chamfer that is formed at the back side die edge (at the intersection of the die sidewall with back side 17 of the die). Such a wraparound terminal has a terminal portion 27 on the front edge chamfer, and a terminal portion 28 on the die sidewall, and a terminal portion 29 on the back edge chamfer.

FIGS. 2A-2F show arrangements of die as in, respectively, FIGS. 1A-1F, oriented one over another (in these examples, each having three die in the stack). The die are shown "vertically" arranged; that is, they are aligned generally vertically with respect to an arbitrarily assigned "horizontal" plane of the front or back sides of the die, and, accordingly, they may be vertically interconnected at the vertical stack face, for example using a trace of electrically conductive epoxy.

Figure 2A:
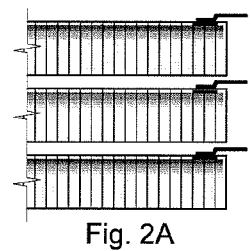
FIGS. 2A-2F are diagrammatic sketches in sectional view showing stacks of die having die edge configurations as in FIGS. 1A-1F.
Figure 2B:
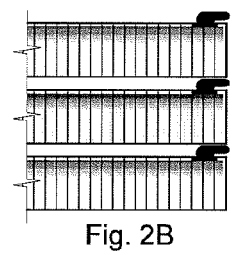
Figure 2C:
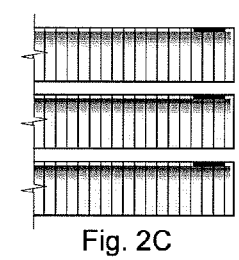
Figure 2D:
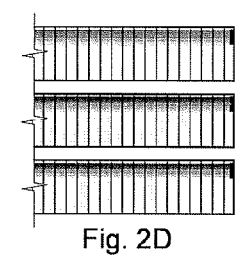
Figure 2E:
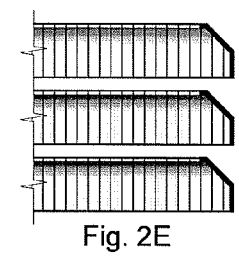
Figure 2F:
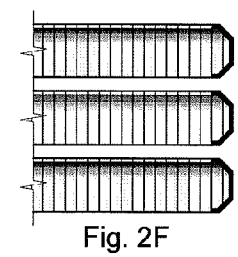

As FIG. 2A shows, the off-die terminals project at the stack face, making them available for connection by a variety of methods. And as FIG. 2B shows, in embodiments where the globs 23 of electrically conductive material extend to or slightly beyond the stack face, the globs are similarly available for connection by a variety of methods. As FIG. 2C shows, interconnect terminals 24 in the margin of the active side of the die are beneath the margins of die stacked over them (except that the active side of one of the die is exposed and readily accessible for interconnection). As FIGS. 2D, 2E, and 2F show, by contrast, interconnect terminals 26 formed in the die edge 19 (FIG. 1D), and wraparound interconnect terminals 27, 28 (FIG. 1E) or 27, 28, 29 (FIG. 1F) are presented at the stack face for interconnection.

FIGS. 3A-3F show stacked die arranged generally as in FIGS. 2A-2F, respectively. Here each die 32 is covered with a conformal insulative coating 34, having openings 35 over the die pads.

Figure 3A:
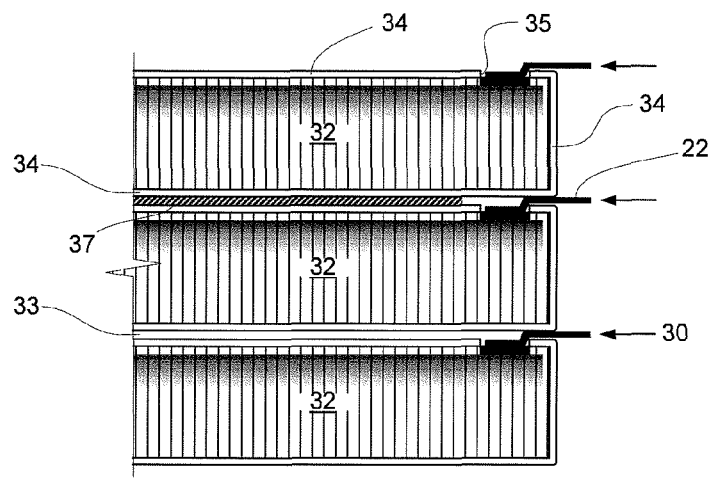
FIGS. 3A-3F are diagrammatic sketches in sectional view showing stacks of die having die edge configurations as in FIGS. 1A-1F, in which the respective die are covered by a conformal dielectric coating.
Figure 3B:
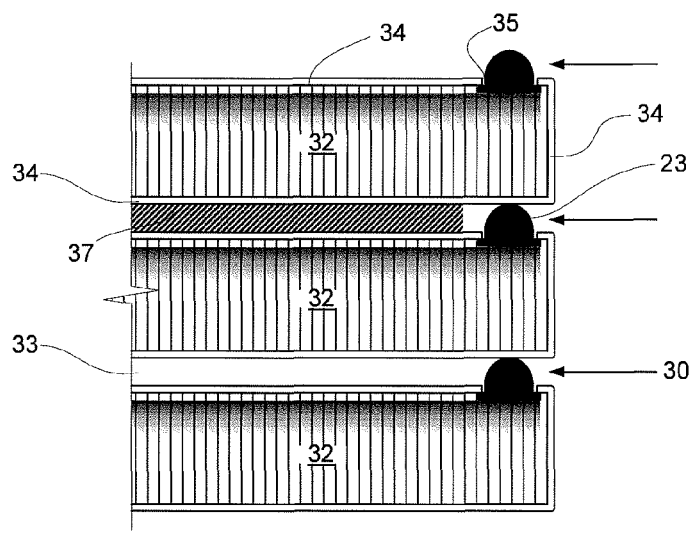

FIG. 3A shows a three-die stack of die having off-die terminals 22. Because the off die interconnect terminals in this example stand above the front side of the die, adjacent die in the stack are separated by a space 33. A spacer (as shown for example between two of the die, at 37) may optionally be interposed in the space 33 to support adjacent die; optionally the spacer may be a film adhesive of suitable thickness both to fill the space and to affix the die to one another. The off-die interconnect terminals 22 are vertically aligned, and are presented at the stack face as indicated by arrows 30, so that they may be readily interconnected using, for example, a vertically-oriented interconnect, as described generally in U.S. Pat. No. 7,245,021, for example.

FIG. 3B shows a three-die stack of die having globs 23 of an electrically conductive polymer material deposited onto the die pad 13 in the example shown here, the glob is formed entirely above the exposed die pad, and does not extend toward the stack face (compare, FIGS. 1A, 2A. As in the example of FIG. 3A, the globs stand above the front side of the die, so that adjacent die in the stack are separated by a space 33 and, optionally, a spacer (as shown for example between two of the die, at 37) may optionally be interposed in the space 33 to support adjacent die; and optionally the spacer may be a film adhesive of suitable thickness both to fill the space and to affix the die to one another. Although the glob 23 in this example does not extend toward the stack face, it permits access to a portion of the interconnect material (not shown in this FIG.) that intrudes into the space between the die at the die edge, as suggested by the arrows 30.

Figure 3C:
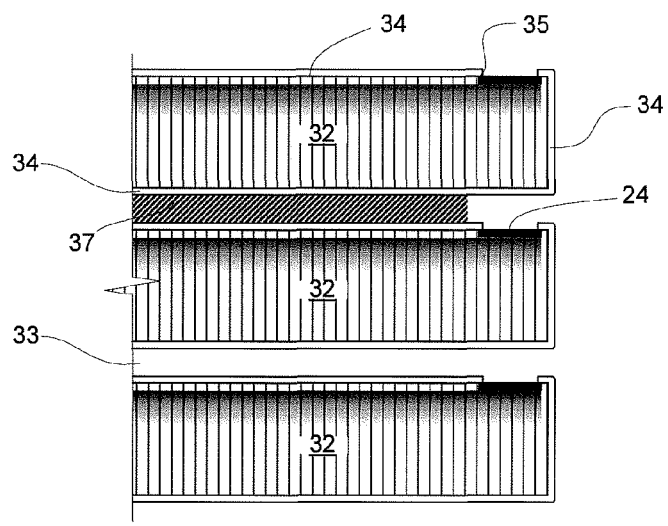

FIG. 3C shows a three-die stack of die having an interconnect terminal 24 formed in or at the active side of the die, at or near the margin of the die where the active side of the die meets the die sidewall. In such a configuration the interconnect terminals 24 of lower die in the stack (that is, all the die except the uppermost die in the stack) are overlain by die stacked over them. Interconnection of die in such a stack may be made by a vertically-oriented interconnect at the stack face, provided that the interconnect intrudes between adjacent die onto the interconnect terminals 24. For example, the interconnect material as applied (such as an electrically conductive epoxy) has some capacity to flow into the space at the margin between adjacent die, to make electrical connection with interconnect terminals in the margin at the active side of the die. This necessitates providing a separation 33 between adjacent die sufficient to permit the intrusion. As in the configuration shown in FIG. 3A, a spacer may optionally be interposed in the space 33 to support adjacent die, as shown for example between two of the die at 37 in each of FIGS. 3A, 3B, 3C; and optionally the spacer may be a film adhesive of suitable thickness both to fill the space and to affix the die to one another. The spacer is located or sized (e.g., it is made smaller than the die) so that it does not block the interconnect terminals.

Figure 3D:
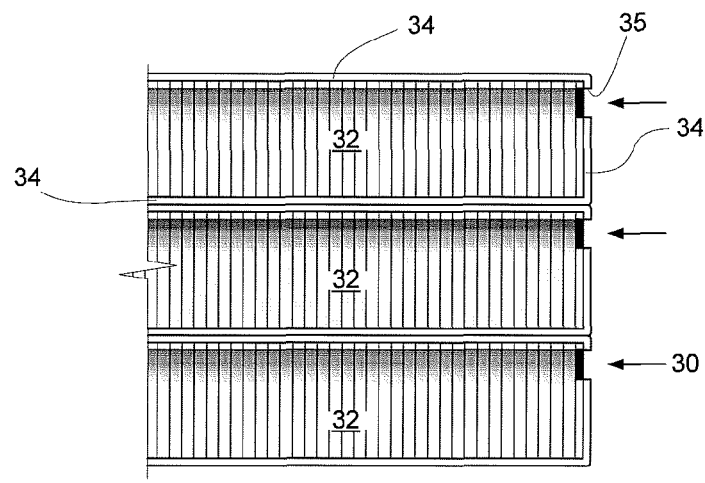
Figure 3E:
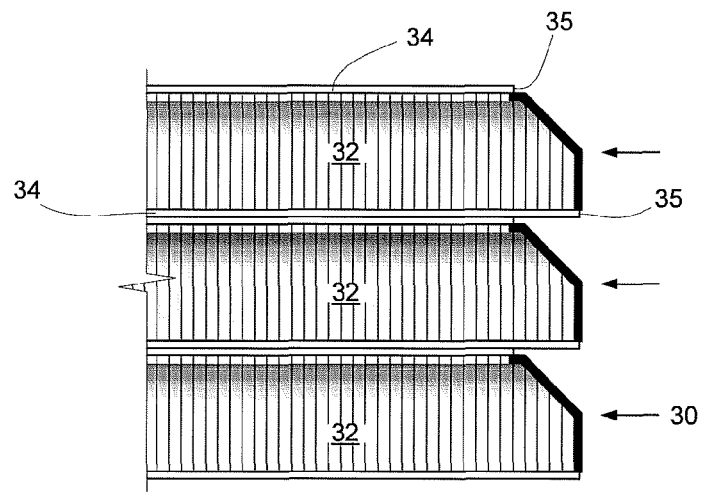
Figure 3F:
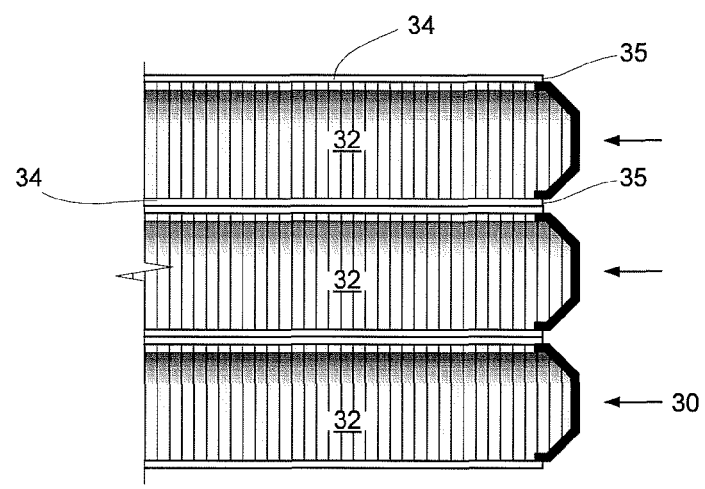

Each of FIGS. 3D, 3E, and 3F shows a three-die stack of die having an interconnect terminal formed in or at the die sidewall and presented at the stack face as shown by the arrows 30. In these examples the conformal coating covers at least the front side and the back side of the die. Such a configuration may be made by coating the entirety of all surfaces of the die and then forming openings through the coating to expose the underlying interconnect terminals; or such a configuration may be made by coating only the front surface and the back surface of the die, leaving the interconnect terminals uncoated. Because in these examples the interconnect terminals are presented at the stack face, and because the interconnect terminals do not stand above the front side of the die, no space is required between adjacent die in the stack (except for the thickness of the conformal coating). Accordingly, as the FIGs. illustrate, the surface of the coating at the backside of an upper die can rest directly upon the surface of the coating on the front ("active") side of the adjacent lower die in the stack. As described in more detail below, in some embodiments a conformal coating may be formed following stacking, and in some embodiments a conformal coating may be formed following mounting of the die stack onto a support. Openings are formed in the conformal coating at sites on the die or on the support at which electrical interconnection is to be made.

Stacked die in configurations as shown for example in FIGS. 3D, 3E, and 3F can be readily interconnected using, for example, a vertically-oriented interconnect.

The invention provides stacked die assemblies having improved stacking arrangements, particularly for die having interconnect terminals situated at the front side of the die, and improved die-to-die interconnection within the stacks. Adjacent die in the stack are offset, and pads on the various die are interconnected using an electrically conductive polymer, such as a conductive epoxy, which is deposited in a pattern constituting traces contacting successive pads.

Figure 4A:
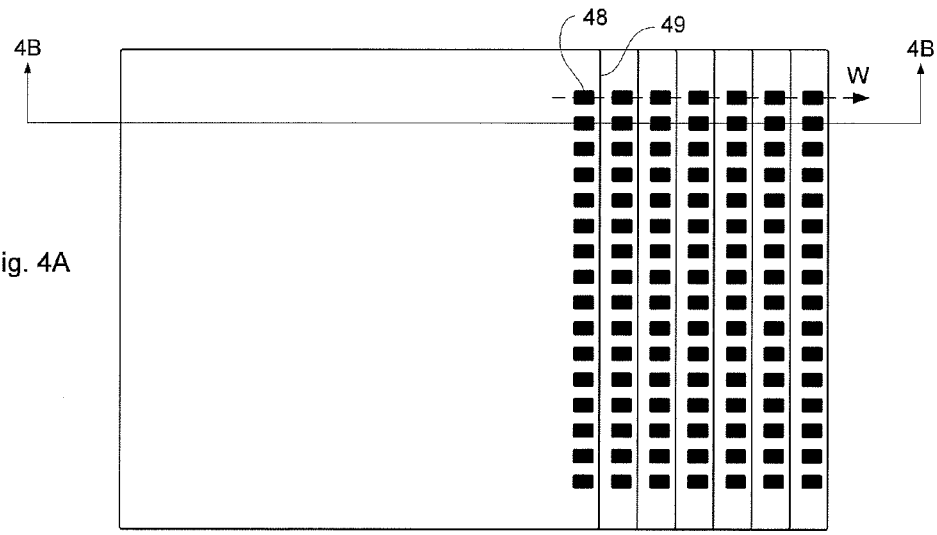
FIG. 4A is a diagrammatic sketch in a plan view showing a stack of die according to an embodiment of the invention.
Figure 4B:
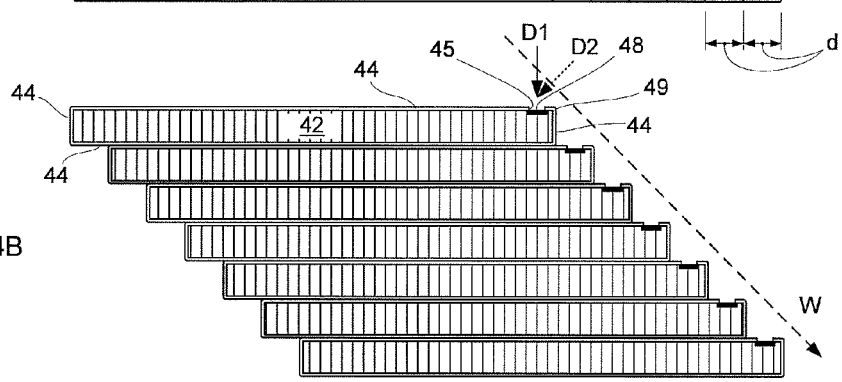
FIG. 4B is a diagrammatic sketch showing interconnected stacked die assemblies in a sectional view as indicated at 4B-4B in FIG. 4A.

FIG. 4A shows in a plan view an arrangement of stacked offset die, each die having interconnect terminals arranged in one margin adjacent a front die edge; and FIG. 4B shows the stack in a sectional view as indicated at 4B-4B in FIG. 4A. Referring to the uppermost die 42 in the stack, for example, interconnect terminals 48 are in this example situated in a row alongside front die edge 49. The die 42 in this example is covered on all surfaces (back surface, front surface, sidewalls) by a conformal coating 44, provided with openings 45 exposing interconnect pads 48. Successive coated die in the stack may, as in these examples, rest directly one upon another, such that the coating on the back side of an upper die can contact the coating on the front side of the underlying die. Optionally, or additionally, a die attach film may be laminated onto the back side of one or more of the die.

In the example shown in FIGS. 4A and 4B the die are all of the same size, and the pads are located along only one die edge. Accordingly, successive die in the stack are displaced (offset) only in a direction orthogonal to a die edge along which the pads are situated.

Figure 5:
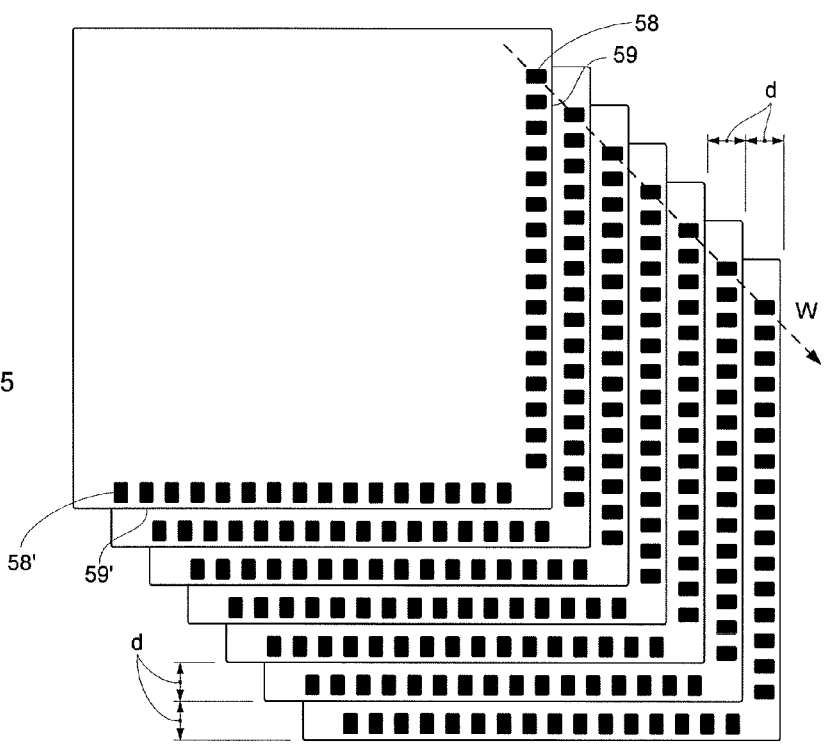
FIG. 5 is a diagrammatic sketch in a plan view showing a stack of die according to another embodiment of the invention.

FIG. 5 shows in plan view an arrangement of stacked offset die, each die having interconnect terminals arranged in a margin adjacent each of two front die edges having a common die corner. Referring to the uppermost die in the stack, for example, interconnect terminals 58, 58' are in this example situated in a row alongside each of front die edges 59, 59'. As in the example of FIGS. 4A, 4B, the die in this example are covered on all surfaces (back surface, front surface, sidewalls) by a conformal coating, provided with openings exposing interconnect pads 58, 58'. Successive coated die in the stack may rest directly one upon another, such that the coating on the back side of an upper die can contact the coating on the front side of the underlying die. Optionally, a die attach film may be laminated onto the back side of one or more of the die.

Die pads in processed semiconductor wafers as provided, or in singulated die, may not be arranged along one die edge, or along two adjacent die edges. The pads may be arranged in one or two rows near a centerline of the die, for example; or, if arranged along die edges, they may be arranged along two opposite die edges or along all four die edges, for example. Or, whatever the arrangement of pads on the wafer or on the die as provided, they may not be arranged in a suitable manner for a given end use; they may be located in an unsuitable sequence, or at an unsuitable pitch, for example). In such instances, the wafer or die as provided may be if desired be further processed to reroute the original pads to new pad positions along one die edge or along two die edges, prior to mounting the die in stacks for interconnection according to the invention.

Also typically, a wafer as provided, or a singulated die, may optionally have a dielectric layer (such as glass, silicon nitride, polyimide, or a benzcyclobutene (BCB) polymer, for example) formed over the integrated circuitry except over the original die pads. This may suffice to provide electrical insulation of circuitry in the active side of the die from electrical conductors (including, for example, a first layer of rerouting circuitry) that may be formed over the front side of the die or wafer. Optionally a dielectric layer (such as glass, silicon nitride, polyimide, or a benzcyclobutene (BCB) polymer, for example) may additionally be formed over the rerouting circuitry except over the new (rerouted) interconnect pads. In such instances additional insulation between the front side of a die and the back side of a die stacked over it may be unnecessary.

In the example shown in FIG. 5 the die are all of the same size; here the pads are located along two adjacent front edges. Accordingly, successive die in the stack are displaced with respect to both die edges along which the pads are situated.

As FIGS. 4A and 5 show, the die stack has a greater footprint than a single die, as a result of the horizontal displacement of the die. It may be preferable to minimize the footprint of the stack, and this may be accomplished by reducing the extent of horizontal displacement of the die. Each die need be displaced only to an extent at least sufficient to expose enough of the area of the pads in the underlying die to permit the interconnect material to make reliable electrical contact with the pads and, accordingly, the extent of displacement, indicated for example at d in the FIGs., is shown greater than necessary. In principle, the displacement may be sufficient if at least a fraction of the area of the pads is left uncovered by the overlying die. (See, for example, FIGS. 14A, 14B.) In practice, if the uncovered area of a pad is too small, the interconnect material as deposited may not contact the pad over an area great enough to establish a reliable electrical connection when the material is cured. It may be preferred to minimize the extent of displacement, so as to minimize the footprint of the stack.

The interconnect material may be an electrically conductive polymer, such as a polymer filled with particles of an electrically conductive material. The material may a curable polymer, for example, such as electrically conductive epoxy (for example, as silver filled epoxy); and, the interconnect process may include forming traces of the uncured material in a prescribed pattern and thereafter curing the polymer to secure the electrical contacts with the terminals and the mechanical integrity of the traces between them. Or, the interconnect material may be an electrically conductive ink.

For the interconnect process in the examples shown in FIGS. 4A-7, the stack may be supported, for example, at the back side of the lowest of the die in the stack, and the interconnect material may be applied along a trajectory over the pads to be connected and the die surfaces between them. The interconnect material may be applied using an application tool such as, for example, a syringe or a nozzle. The material exits the tool in a deposition direction generally toward the interconnect terminals, and the tool is moved over the die stack face in a work direction. Referring to FIGS. 4A, 4B, 5, the interconnect material can be deposited in a deposition direction (two possible directions for the deposition (i.e., material flow from the tool) are shown: D1 generally perpendicular to the surface of the interconnect terminal, and D2 at an angle away from perpendicular) while the tool is moved in a work direction W. The material may be extruded from the tool in a continuous flow, or, the material may exit the tool dropwise. In some embodiments the material exits the tool as a jet of droplets, and is deposited as dots which coalesce upon or following contact with a stack face surface. In some embodiments the deposition direction is generally perpendicular to the die edge surface, and in other embodiments the deposition direction is at an angle off perpendicular to the die edge surface.

Figure 6A:
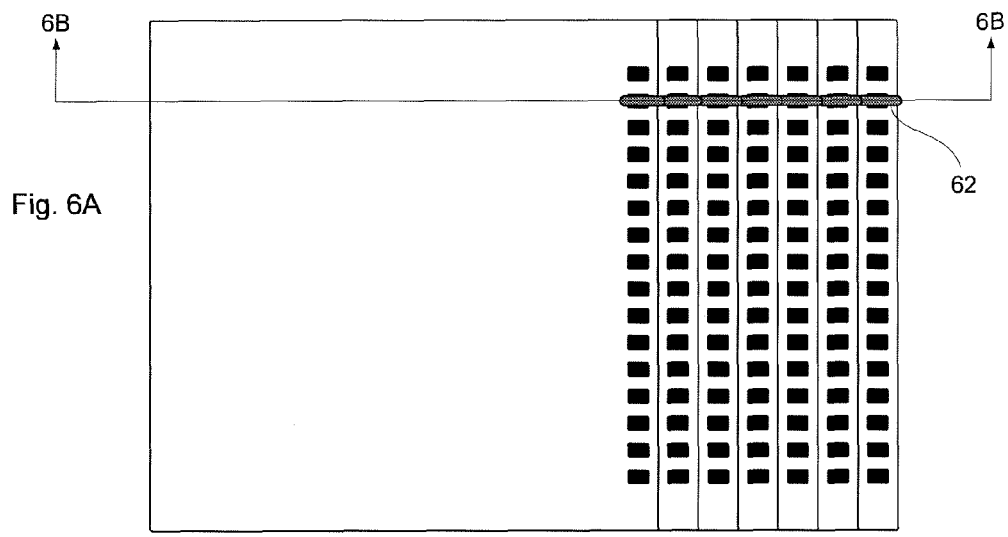
FIG. 6A is a diagrammatic sketch in a plan view showing interconnection of pads in a stack of die as in FIG. 4A according to an embodiment of the invention.
Figure 6B:
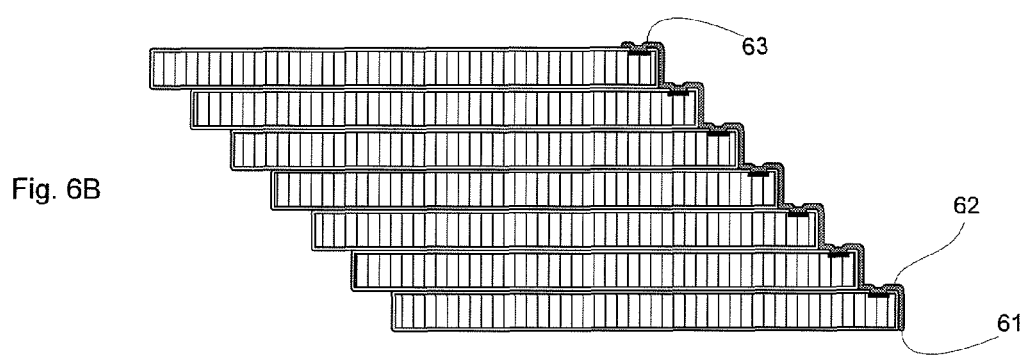
FIG. 6B is a diagrammatic sketch showing interconnected stacked die assemblies in a sectional view as indicated at 6B-6B in FIG. 4A.
Figure 7:
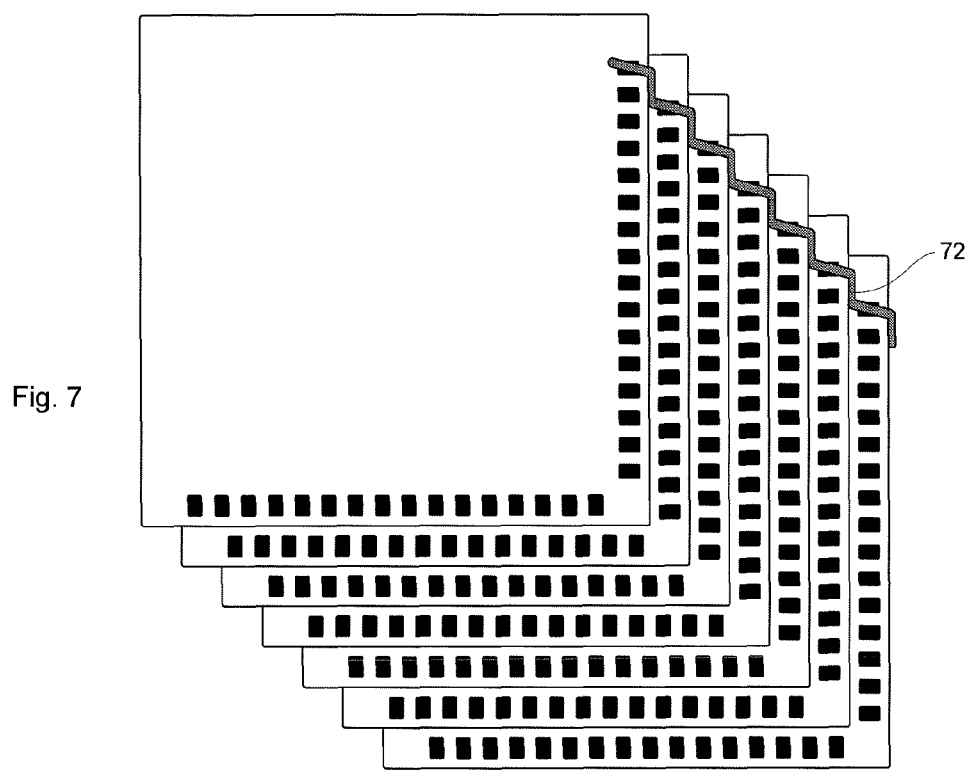
FIG. 7 is a diagrammatic sketch in a plan view showing interconnection of pads in a stack of die according to another embodiment of the invention.

Die stacks having resulting traces of interconnect material are shown by way of illustration at 62 in FIGS. 6A, 6B, and at 72 in FIG. 7. This procedure is repeated to deposit traces connecting all the pads for which electrical interconnection is desired, and following deposition the material is cured. Optionally, a cure or partial cure of the interconnect material may be carried out prior to completion of a trace.

Assemblies of electrically interconnected stacked die can optionally be tested prior to further processing. Complete assemblies can be mounted on a support, and interconnected die in the stack can be connected with underlying circuitry associated with the support by way of secured electrical contact with the interconnections. For example, a printed circuit board or package substrate can be provided, having bond pads arranged at a die attach side to correspond with the ends 61 or 63 of the die stack interconnects. Referring to FIG. 6B, for example, the interconnect 62 has an end 63 at the margin of the active side of a die at the top (or, if the assembly is inverted, at the bottom) of the assembly, and an end 61 at a back side edge of a die at the bottom (or, if the assembly is inverted, at the top) of the assembly. A PCB or substrate, for example, can be provided having z-interconnect sites arranged in a manner corresponding to the arrangement of interconnect ends 61 or 63. The assembly can be mounted on the support for example with the active sides of the die facing toward the substrate, and with the interconnect ends 63 aligned with and contacting the z-interconnect sites; or for example with the back sides of the die facing toward the substrate, and with the interconnect ends 61 aligned with and contacting the z-interconnect sites. Alternatively, for example, the assembly can be mounted with the die oriented perpendicularly to the PCB or substrate, with the interconnect ends 61 aligned with and contacting the z-interconnect sites.

Alternatively, die can be stacked on a support, or stacked die assemblies can be mounted on a support prior to interconnection. In such embodiments interconnection of the die in the stack and of the underlying circuitry with the die are carried out at the same time, or concurrently.

The die may be all of the same size, as shown in the FIGS. 4A, 4B, 5 (and 6A, 6B, 7), but die of different sizes may according to the invention be stacked and interconnected by conductive polymer traces. In some embodiments for example, a smaller die may be stacked on a larger die, with the smaller die situated so that peripheral die pads in the margin near at least one die edge of the larger die are available for interconnection. In such an arrangement the stack of die may appear in section as a stepped pyramid; or, the die may be displaced in one direction with respect to a first die edge, but vertically interconnected on another die edge. An upper die may be larger in one dimension (that is, the die may be same width but one longer than the other), or in both directions (that is, one die both wider and longer than the other) than a lower die. For example, a 10×10 mm die may be stacked over a 10×12 mm die having peripheral pads at the shorter edges. In such an embodiment the smaller die is situated over the larger die such that the die pads at the narrow ends of the larger die are exposed adjacent two edges of the smaller die. Or, for example, a 10×10 mm die may be stacked over a 12×12 mm die, and situated such that peripheral pads along any one or more (or all four) edges of the larger die are available for interconnection. Various examples are shown highly diagrammatically, with details omitted for simplicity, in FIGS. 13A-13C.

Stacked die assemblies according to the invention may have as many die as may be desired, and there may as a matter of mechanical design be no upper limit. The illustrated examples show seven die in each stack, but assemblies having two or more die in the stack are contemplated. Particularly, for example, assemblies having four, or six, or eight, or 9, or 16 or 17 die may be made in the manner illustrated in FIGS. 6B or 7. In some examples a stack of 9 die may include 8 memory die and a controller die.

Figure 8A:
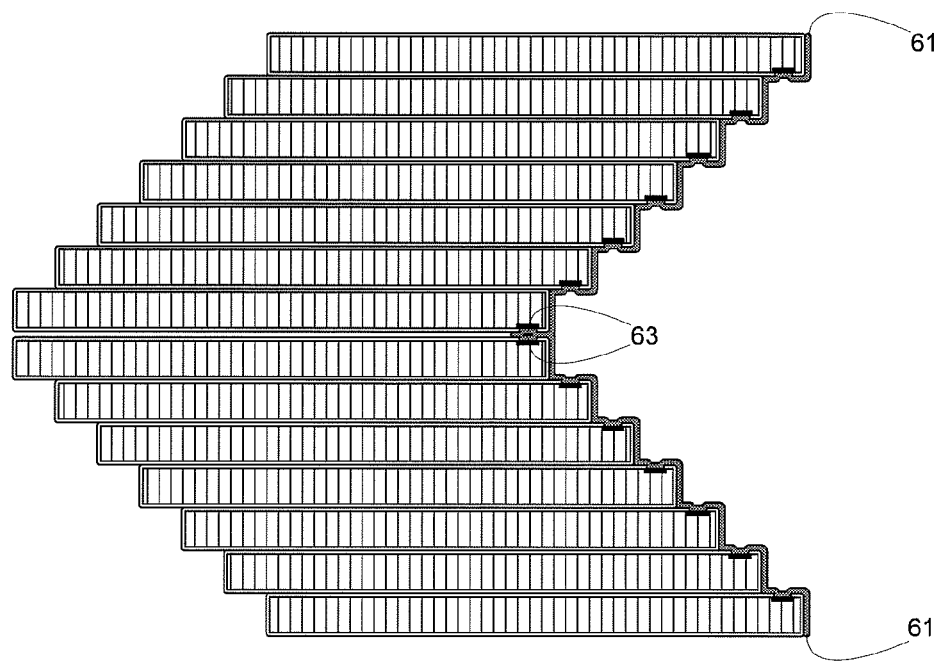
FIG. 8A is a diagrammatic sketch in a sectional view showing a tiered stack of two interconnected die stack assemblies according to an embodiment of the invention.
Figure 8B:
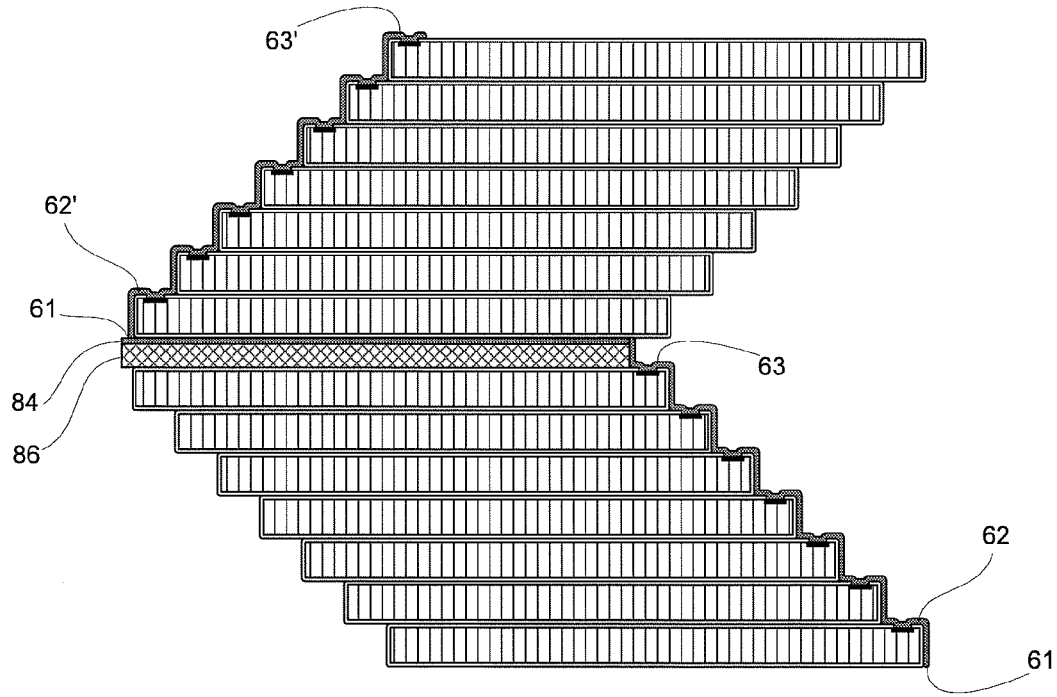
FIG. 8B is a diagrammatic sketch in a sectional view showing a tiered stack of two interconnected die stack assemblies according to another embodiment of the invention.

Additionally, or alternatively, larger stacked die assemblies may be made by constructing stacked die units in a modular design, and then stacking units, as illustrated for example in FIGS. 8A, 8B. In some such embodiments, an assembly as shown for example in FIG. 6B may constitute a modular unit; and a second similar modular unit may be inverted and mounted over it, with the interconnect ends 63 of the respective modular units aligned and connected. A resulting assembly is shown by way of example in FIG. 8A. A third modular unit may be mounted over the two-unit assembly to form a three-unit assembly, with the interconnect ends 61 of the third unit aligned and connected with the interconnect ends 61 at one edge of the two-unit assembly.

A spacer may be provided between the stacked modular units in an assembly as shown in FIG. 8A. As may be appreciated, where the first and second modular units are identical, when the second unit is inverted the respective rows of pads at the interconnect ends 63 are antiparallel; that is, a first interconnect on the first unit is now aligned with a last interconnect on the second die. In such configurations, rerouting circuitry may be required, to connect the appropriate respective features 61, 63. Rerouting circuitry may be provided at the active side the top die of the first unit; or, where a spacer is included, the spacer may constitute an interposer, including one or more dielectric layers and one or more conductive rerouting layers.

In other embodiments an assembly as shown for example in FIG. 6B may constitute a modular unit; and a second similar modular unit may be mounted over it, but not inverted. Here with the interconnect ends 61 of the second modular unit are near the opposite edge of the top die in the first modular unit. An interposer, including at least one dielectric layer 86 (such as glass, for example) and at least one patterned conductive layer 84 is situated between the modular units, to provide rerouting from the interconnect ends 63 on one edge of the first unit to the interconnect ends 61 on the (oppositely situated) edge of the second unit. A resulting assembly is shown by way of example in FIG. 8B. Here, too, a third modular unit may be mounted over the two-unit assembly to form a three-unit assembly, with an interposer situated between successive stacked units.

The stackable modular units can be robust and testable. For example, particular two-die units and four die units may constitute modules; from these modules a six-die assembly may be made by stacking a two-die unit and a four-die unit, or an eight-die assembly may be made by stacking two four-die units, for example.

Figure 9A:
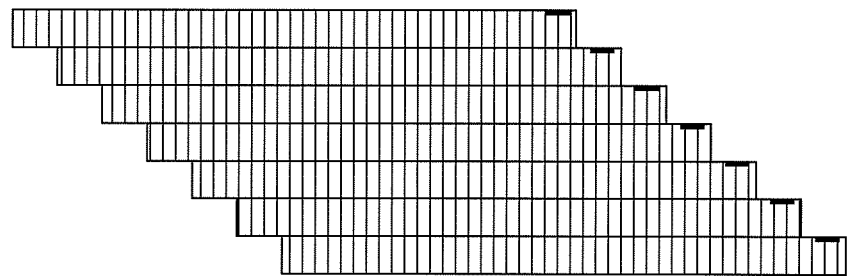
FIGS. 9A-9C are diagrammatic sketches in sectional view showing stages in preparation of a conformally coated stack of die according to an embodiment of the invention.
Figure 9B:
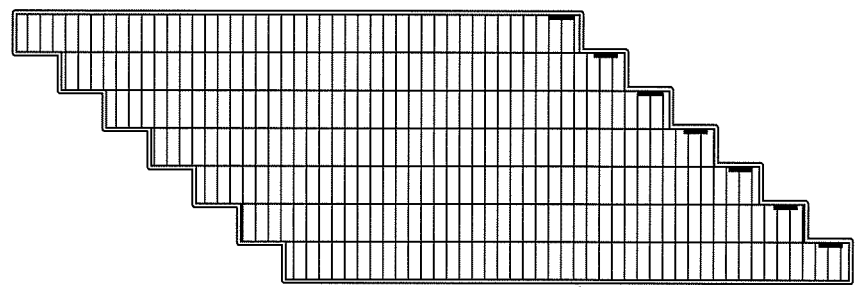
Figure 9C:
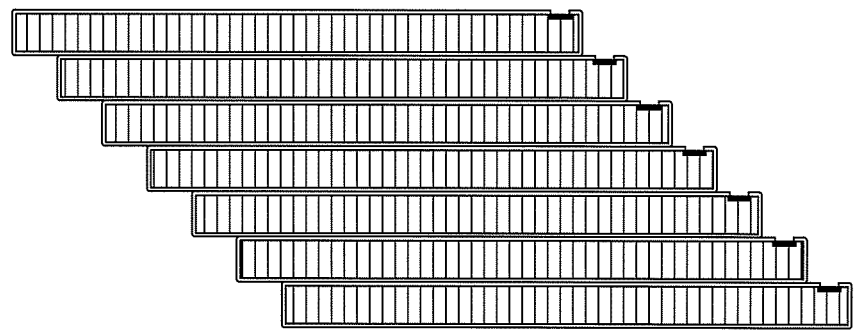

As noted above, the die as provided (or as processed to reroute the interconnect pad locations) may have a dielectric layer over the front side (except over the interconnect pads, which are exposed for interconnection), and for such die electrical insulation between adjacent die in the stack, as would be provided by the conformal die coating, is unnecessary. That is, the die as provided or as rerouted, insulated with a dielectric layer over the front side, may be stacked one directly upon another in an offset configuration, as shown for example in FIG. 9A. A completed assembly of such die in a stack may be provided with a conformal coating, resulting in a coated stacked die assembly, as shown for example in FIG. 9B; as may be appreciated, such a stack may be mounted on a support such as a substrate or printed circuit board or leadframe prior to coating; in such embodiments the coating may cover exposed areas of the support as well. Additionally or alternatively a thin space between adjacent die may admit the conformal coating material, providing for electrical insulation between adjacent die (if the space is sufficiently thick), as well as adhesion of adjacent die in the stack. Such a space may be provided by placing spacers over the component, and then stacking the overlying adjacent component onto the spacers, as described for example in U.S. Provisional Application No. 60/971,203, the pertinent portions of which are hereby incorporated herein by reference. The spacers have nominally the same height, to provide a standoff between overlying adjacent components in a range, for example, about 1 um to about 5 um. This is described below in further detail with reference to FIGS. 23A-23C. Openings through the conformal coating are then formed to expose interconnect pads, resulting in a stack of die, as shown for example in FIG. 9C, ready for interconnection generally as described above with reference to FIGS. 4A, 4B, 5 and 6A, 6B, 7. Or, a configuration as in FIG. 9C may result from applying a conformal coating to all surfaces of each die, and thereafter stacking the die in an offset configuration; in such embodiments openings may be made over the interconnect pads either prior to or following stacking the die.

Figure 10A:
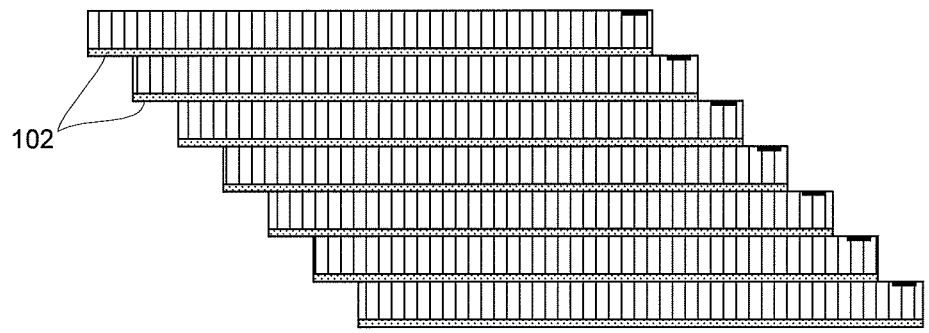
FIGS. 10A-10C are diagrammatic sketches in a sectional view showing stages in preparation of a conformally coated stack of die according to another embodiment of the invention.
Figure 10B:
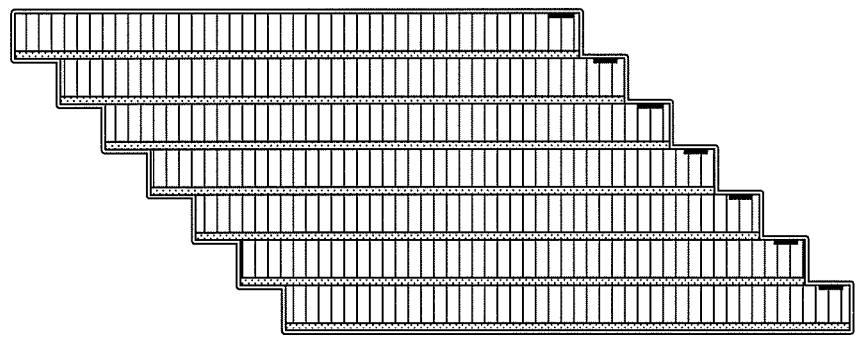
Figure 10C:
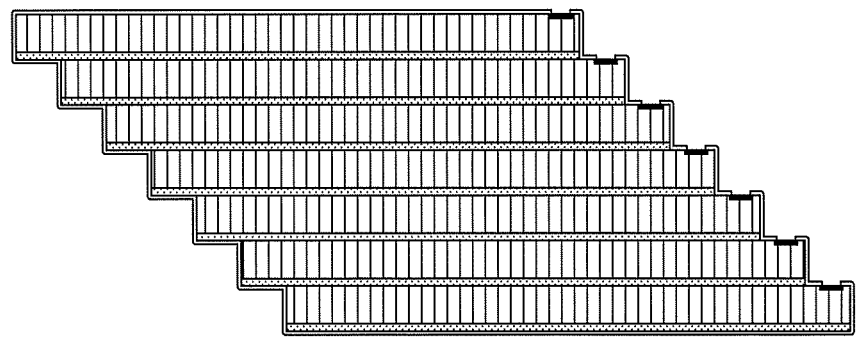

Alternatively, where insulation is required between adjacent die in the stack, an electrically insulative adhesive may be applied between adjacent uncoated die in the stack. The adhesive may be a curable dielectric polymer for example, such as a die attach epoxy; this may be applied onto a surface of one of the die and then the die put together to form a uniform adhesive layer between them. Or, alternatively, for example, the adhesive may be an epoxy preform or dielectric film adhesive (die attach film); this may be applied to a surface of one of the die, and the die may be mounted together. Where a dielectric film adhesive is used, it may be applied at the wafer level or at the die array level, and cut to size on the die during die singulation or separation. FIG. 10A shows a completed assembly of die having a film adhesive (e.g., 102) between successive die in the stack. As in the assembly of FIG. 9A, completed assembly of such die in a stack as in FIG. 10A may be provided with a conformal coating, resulting in a coated stacked die assembly, as shown for example in FIG. 10B. Openings through the conformal coating are then formed to expose interconnect pads, resulting in a stack of die, as shown for example in FIG. 10C, ready for interconnection generally as described above with reference to FIGS. 4A, 4B, 5 and 6A, 6B, 7.

Stacked die units or assemblies constructed according to the invention can be electrically interconnected with circuitry in a device for use. For example, a stacked die unit can be mounted upon the active side of another die, and electrically interconnected by connection of all or selected ones of the interconnect ends of the unit with pads on the die. Or, for example, a die stack assembly can be mounted on a support having electrical interconnection sites (such as a package substrate or a leadframe, or a printed circuit board, for example), and electrically interconnected by connection of all or selected ones of the interconnect ends of the unit with sites in the substrate.

Figure 12:
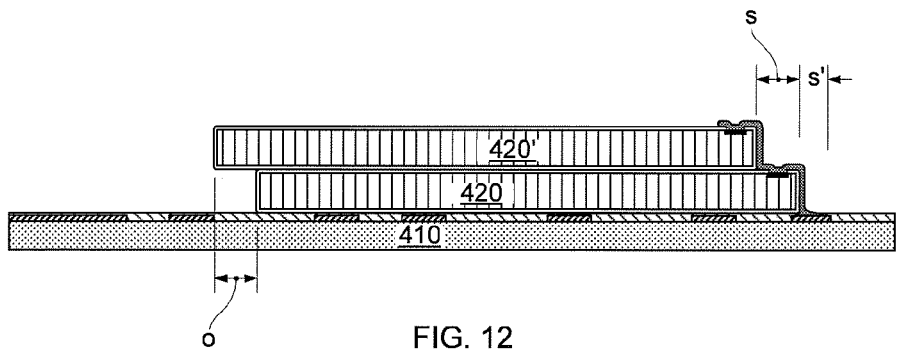
FIG. 12 is a diagrammatic sketch in a sectional view showing a stacked die assembly mounted onto and electrically interconnected with a substrate according to an embodiment of the invention.

FIG. 12 is a diagrammatic sketch illustrating a way in which die stacking and electrical interconnect according to embodiments of the invention can provide for a smaller assembly footprint as compared to conventional die stacking and wire bond interconnection.

Figure 11A:
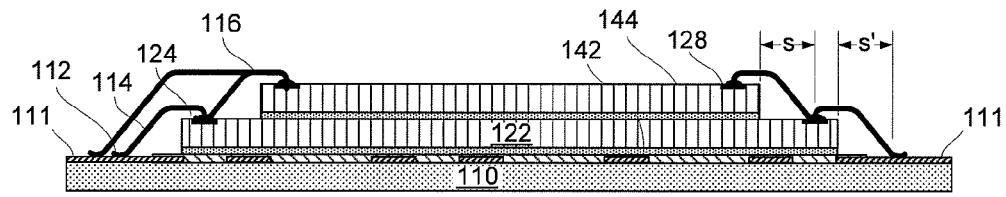
FIGS. 11A and 11B are diagrammatic sketches in sectional view showing conventional wire-bond two-stack assemblies mounted on a substrate.
Figure 11B:
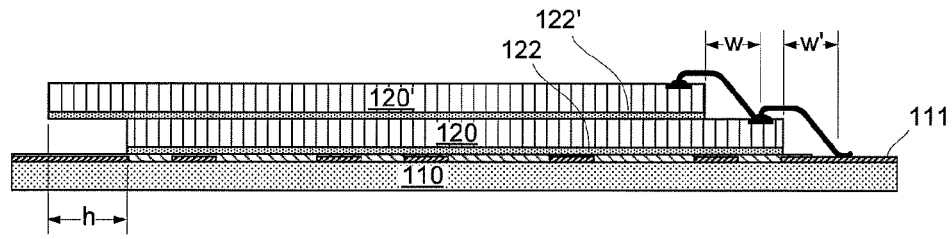

Reference is made to FIGS. 11A and 11B, showing conventional wire bonded stacked die constructs. FIG. 11 shows a two-die stack having a smaller die 126 stacked over a larger die 122, and mounted on a substrate 110. Die 122 is affixed to the substrate by a film adhesive 142; and die 126 is affixed to the die 122 by a film adhesive 144. Die 122 is electrically connected by wire bonds 114 connected to die pads 124 on die 122 and to bond sites 112 on bond pads 111 on the substrate; die 126 is electrically connected by wire bonds 116 connected to die pads 128 on die 126 and to die pads 124 on die 122. The widths of the wire spans (as measured horizontally from the die front edge to the bond site on the feature below (that is, the die pad on the die beneath, or the bond finger on the substrate beneath) are indicated by dimensions s, s' in FIG. 11A. As noted above, the wire span dimension must be great enough to accommodate the movement of the wire bonding tool during the wire bond process, and to provide clearance for the wire at the die edge.

FIG. 11B shows a two-die stack having similarly-dimensioned die 120,120' stacked in an offset arrangement, with die pads along one edge of each die. As in the example in FIG. 11A, the die 120, 120'are affixed to the feature beneath (die or substrate) using a film adhesive 122, 122'. Die 120 is electrically connected by wire bonds connected to die pads on die 120' and to bond sites on bond pads 111 on the substrate; die 120' is electrically connected by wire bonds connected to die pads on die 120' and to die pads on die 120. The widths of the wire spans (as measured horizontally from the die front edge to the bond site on the feature below (that is, the die pad on the die beneath, or the bond finger on the substrate beneath) are indicated by dimensions w, w' in FIG. 11B. The opposite edge of the die 120' overhangs the opposite edge of the die 120 as indicated by dimension h in FIG. 11B; where, as in this example, the die are the same size, the dimension h is the same as the die offset, which is contributed to by the wire span w and the distance between the interconnect sites on the die and the die edge.

Referring now to FIG. 12, in this example a two-die assembly interconnected as in some embodiments of the invention is mounted onto and connected to a substrate 410. The die are provided with a conformal electrically insulative coating, and are stacked and interconnected using, for example, an electrically conductive polymer, generally as described above with reference to FIG. 4A, for example. Here the die 420, 420' are offset by a distance indicated at o in FIG. 12, which (for die having similar dimensions) approximates the offset s The offset (displacement) of the die need be great enough to expose an area of the underlying pads sufficient to provide reliable electrical connections on the pads. Generally, the interconnection must satisfy the resistance requirements of the circuit, and, as may be appreciated, the size of the area will depend among other factors upon the materials employed and the contact resistance, as well as the requirements of the circuitry. The width s' of the area on the substrate where the lowest die in the stack is interconnected with the substrate need not be greater than the bond site dimension on the substrate. In general, the minimum practical die offset in stacked die interconnected according to embodiments of the invention can be in a range approximately one-third to as much as one-eighth the minimum practical offset die for similarly-dimensioned stacked die interconnected by conventional wire bonding. For example, where a conventional wire span for a wire bonded stack is in a range 300 um to 400 um, an interconnect span for a stack of similarly-dimensioned die according to the invention can be about 50 um-100 um in some embodiments.

Figure 14A:
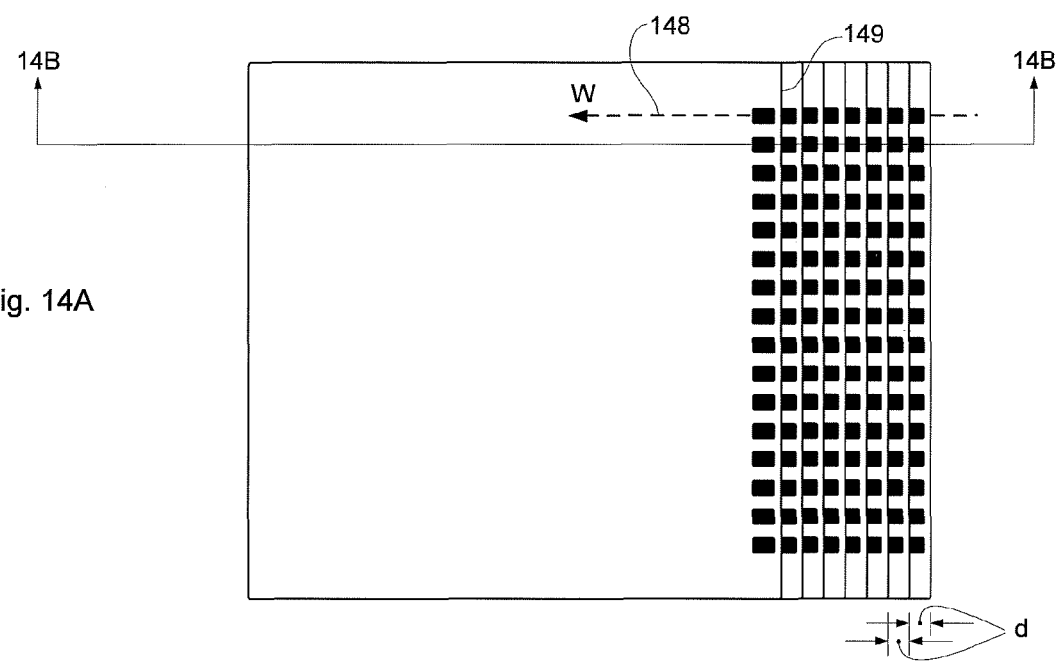
FIG. 14A is a diagrammatic sketch in a plan view showing a stack of die according to an embodiment of the invention.
Figure 14B:
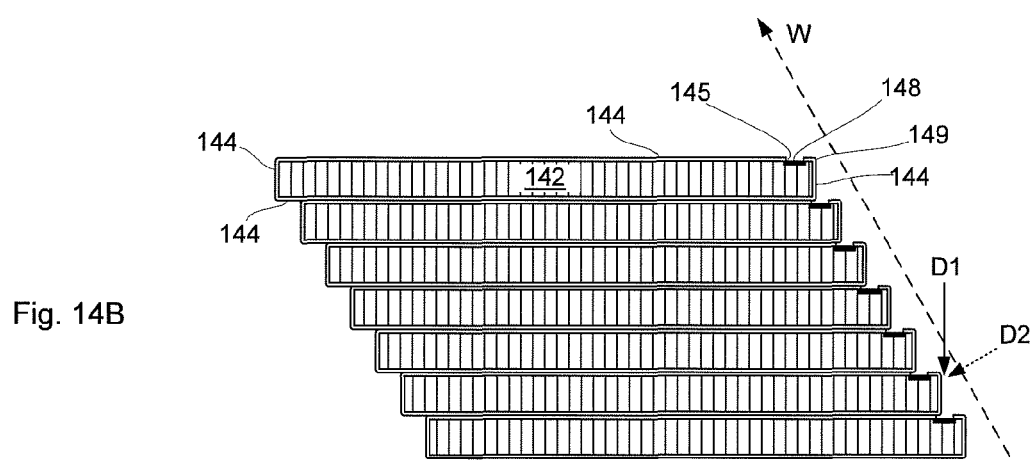
FIG. 14B is a diagrammatic sketch showing a interconnected stacked die assembly in a sectional view as indicated at 14B-14B in FIG. 14A.

As noted above with reference to FIGS. 4A, 4B, the offset may be such that only a portion of the area of the pads is exposed at the edge of an overhanging die. This is illustrated in FIGS. 14A, 14B. FIG. 14A shows in a plan view an arrangement of stacked offset die, each die having interconnect terminals arranged in one margin adjacent a front die edge; and FIG. 14B shows the stack in a sectional view as indicated at 14B-14B in FIG. 14A. Referring to the uppermost die 142 in the stack, for example, interconnect terminals 148 are in this example situated in a row alongside front die edge 149. The die 142 in this example is covered on all surfaces (back surface, front surface, sidewalls) by a conformal coating 144, provided with openings 145 exposing interconnect pads 148. Successive coated die in the stack may, as in these examples, rest directly one upon another, such that the coating on the back side of an upper die can contact the coating on the front side of the underlying die. Optionally, or additionally, a die attach film may be laminated onto the back side of one or more of the die.

In the example shown in FIGS. 14A and 14B the die are all of the same size, and the pads are located along only one die edge. Accordingly, successive die in the stack are displaced (offset) only in a direction orthogonal to a die edge along which the pads are situated. As FIGS. 14A and 14B show, the die stack has a greater footprint than a single die, as a result of the horizontal displacement of the die. Here, the footprint of the stack has been reduced, by reducing the extent of horizontal displacement of the die so that each die is displaced only to an extent at least sufficient to expose enough of the area of the pads in the underlying die to permit the interconnect material to make reliable electrical contact with the pads. In the example shown, the extent of displacement, indicated for example at d in the FIGs., leaves a fraction of the area of the pads uncovered by the overlying die.

Figure 15A:
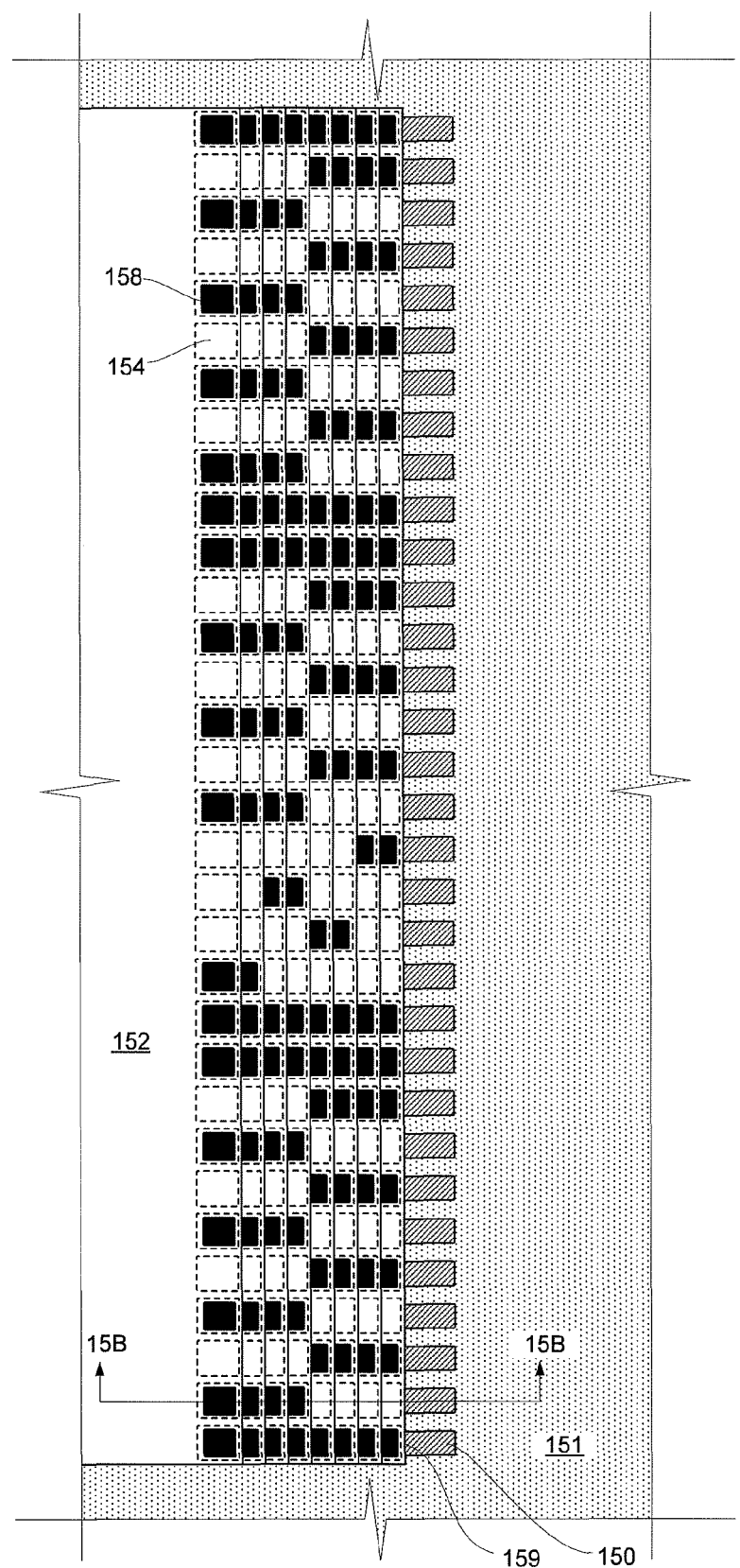
FIGS. 15A is a diagrammatic sketch in a partial plan view showing the offset edges of an embodiment of an 8-die offset stack.
Figure 15B:
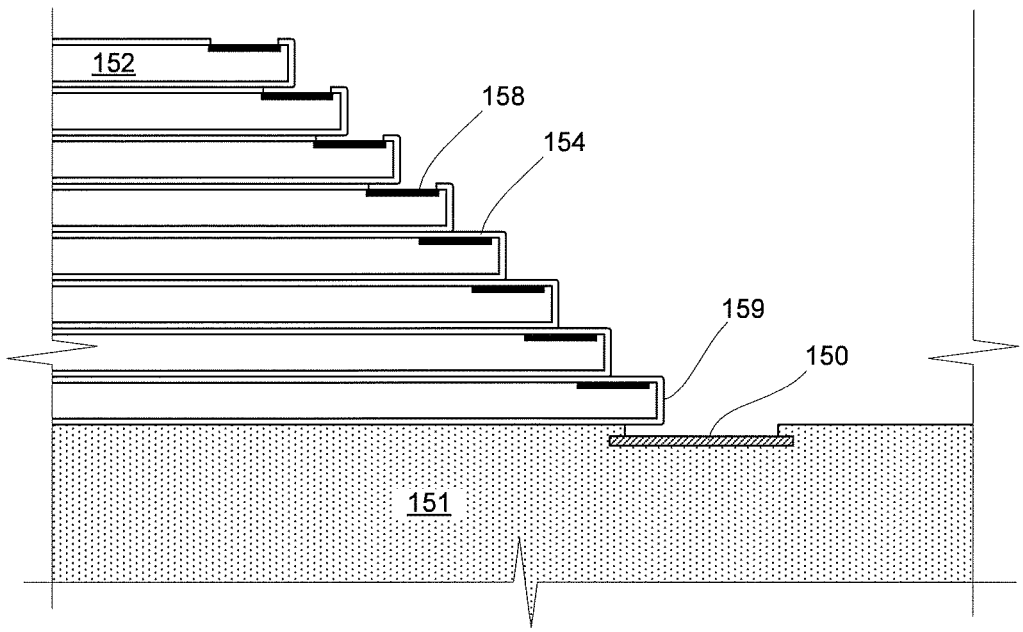
FIG. 15B is a diagrammatic sketch in a partial sectional view of an 8-die offset stack, as indicated at 15B-15B in FIG. 15A.
Figure 16B:
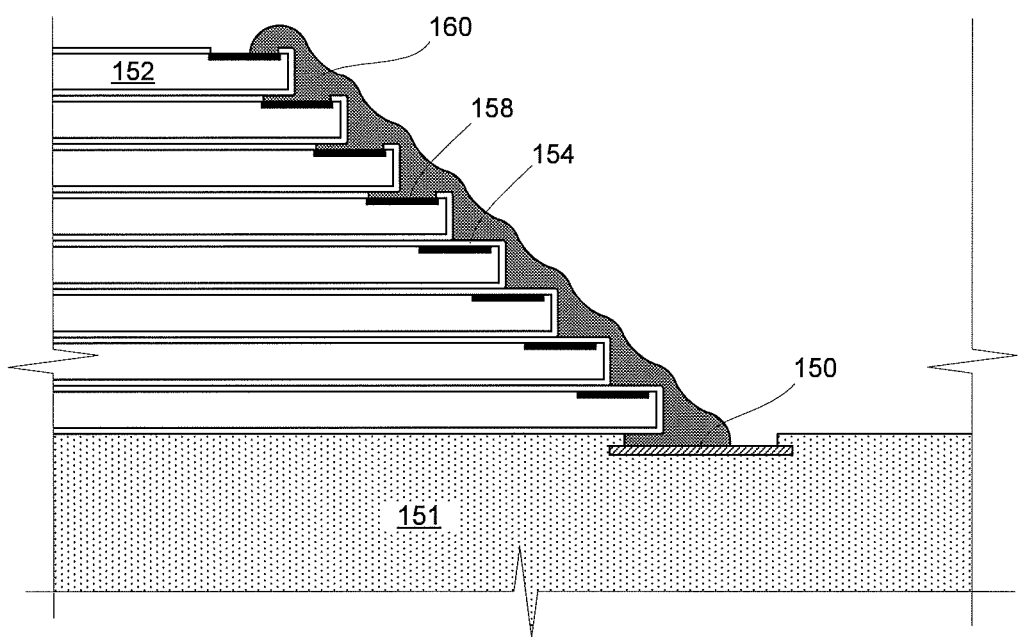
FIG. 16A is a diagrammatic sketch in a partial plan view showing the offset edges of an embodiment of an 8-die offset stack, interconnected.
Figure 16A:
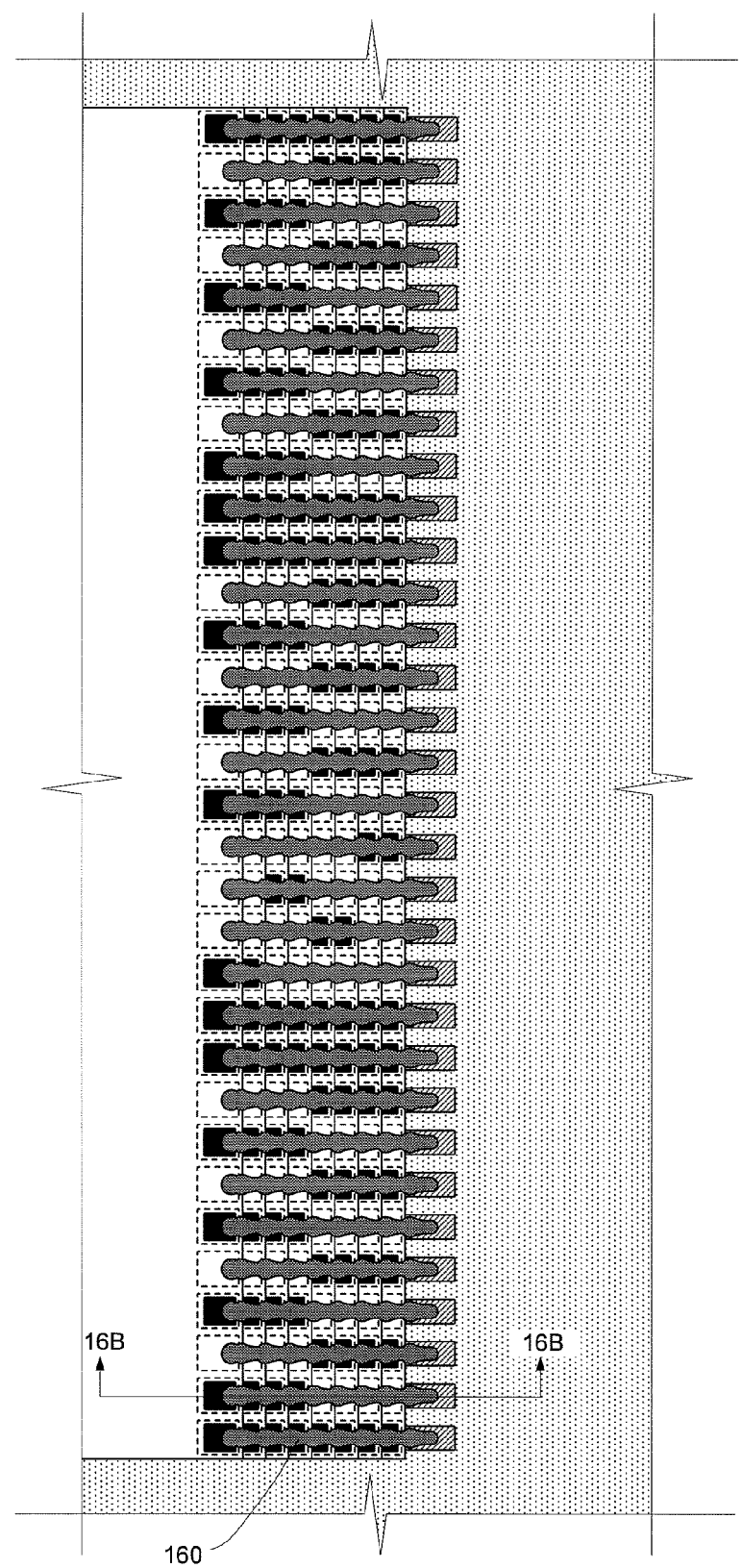

Referring now to FIGS. 15A, 15B, there is shown in more detail the interconnect region of an 8-die offset stack. The stack is mounted on a support (here a substrate) 151 having interconnect sites (leads) 150. In this example the stack edge (lower die edge 159) overlaps the interconnect sites on the substrate, so there is no interconnect span dimension next to the stack. The die in this example are each covered on all sides with a conformal insulative coating (in this example a parylene). Openings through the conformal coating were made in each die to expose selected interconnect terminals 158, while leaving selected other interconnect terminal protected (insulated). FIGS. 16A, 16B show an 8-die offset stack electrically interconnected with interconnect traces 160. The traces electrically connect exposed interconnect terminals 158 to a corresponding interconnect site 150 on the substrate 151.

As noted above, in some embodiments the interconnect material is formed by stencil printing, and this technique may be particularly useful for interconnecting offset die stacks. A stencil having suitable openings (an array of narrow slots, for example) may be aligned over the stack, and the interconnect material may be passed through the openings to the stacked offset die edges beneath. Where the die are sufficiently thin, the vertical elevation of the stencil above the support may be low enough so that the interconnect material is directed accurately to the interconnect terminals and the interconnect sites on the support.

Figure 17:
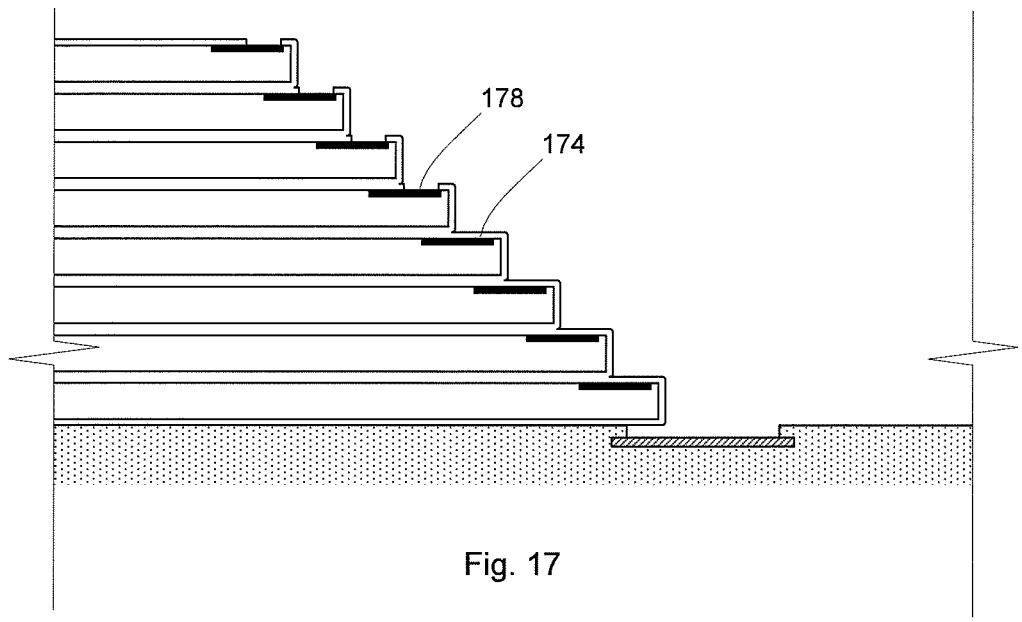
FIGS. 17 and 18 are diagrammatic sketches in partial sectional view of other embodiments of an 8-die offset stack.
Figure 18:
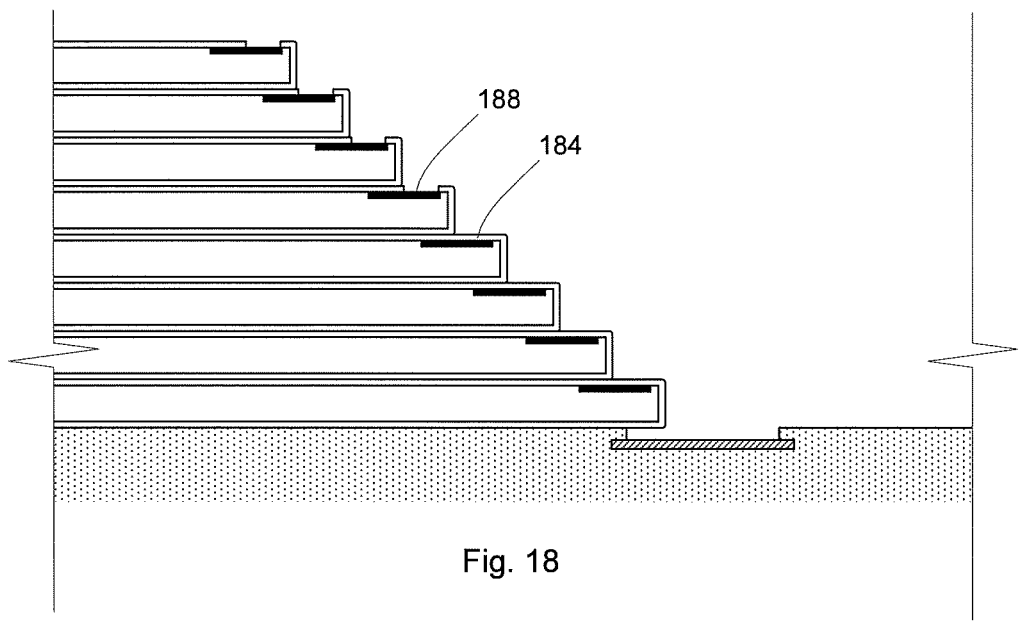

As noted above, the conformal coating may be applied at any of various stages in the process. In FIG. 17, for example, the die were stacked, with spacers between adjacent die to permit the coating material to form between the die; then the conformal insulative coating 174 was formed (in this example a parylene); and then openings were formed to expose selected interconnect terminals 178. The stack is shown mounted on a substrate, generally as in FIG. 16A. In other embodiments, the coating process can be carried out following mounting the stack on the substrate and, in such embodiments, exposed surfaces of the substrate are also coated, and openings must be made in the corresponding interconnect sites on the substrate as well. Following mounting of the stack on the substrate (and forming openings in the coating), the interconnect traces are formed, generally as shown in FIGS. 16A, 16B. And in FIG. 18, for example, the die were coated before stacking, as shown in FIGS. 15A, 15B; here, however, the coated die were stacked and mounted on the substrate; and then openings were formed in the coating 184 (here a parylene) to expose selected interconnect terminals 188. Following mounting of the stack on the substrate (and forming openings in the coating), the interconnect traces are formed, generally as shown in FIGS. 16A, 16B.

Figure 19A:
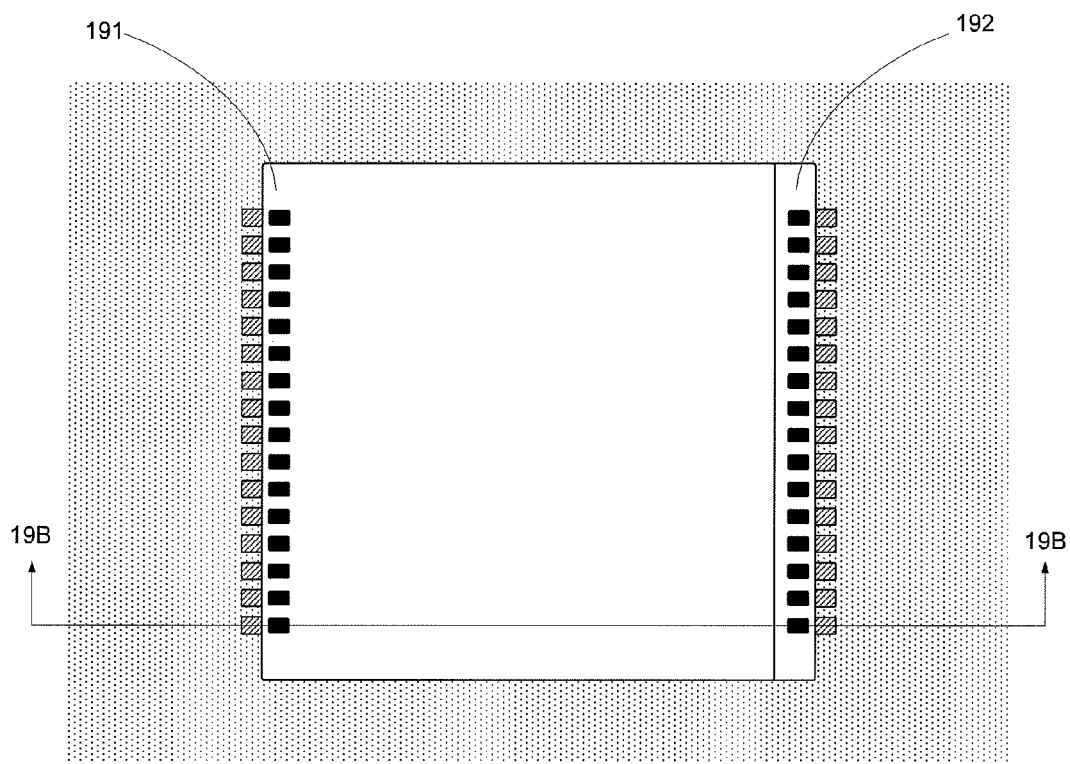
FIG. 19A is a diagrammatic sketch in a plan view showing a stack of die mounted on a substrate, according to another embodiment of the invention.
Figure 19B:
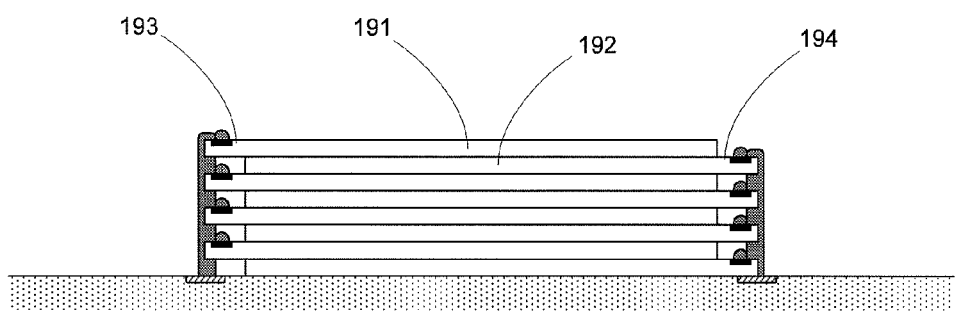
FIGS. 19B and 19C are a diagrammatic sketches showing another embodiment of an interconnected stacked die assembly in a sectional view as indicated at 19B-19B in FIG. 19A.

FIGS. 19A, 19B, show another embodiment of a stacked die assembly, in which adjacent offset die in the stack are mounted one over another so that respective interconnect edges are vertically aligned. For convenience in this description, vertically adjacent die are referred to as a "pair" of die, although they need not be functionally related as a pair nor handled as a pair during processing. The die in each pair, for example the top pair of die 191, 192, are oppositely oriented, so that the interconnect edges 193 and 194 are at opposite sides of the stack. The arrangement is shown in further detail in FIG. 19C.

Figure 19C:
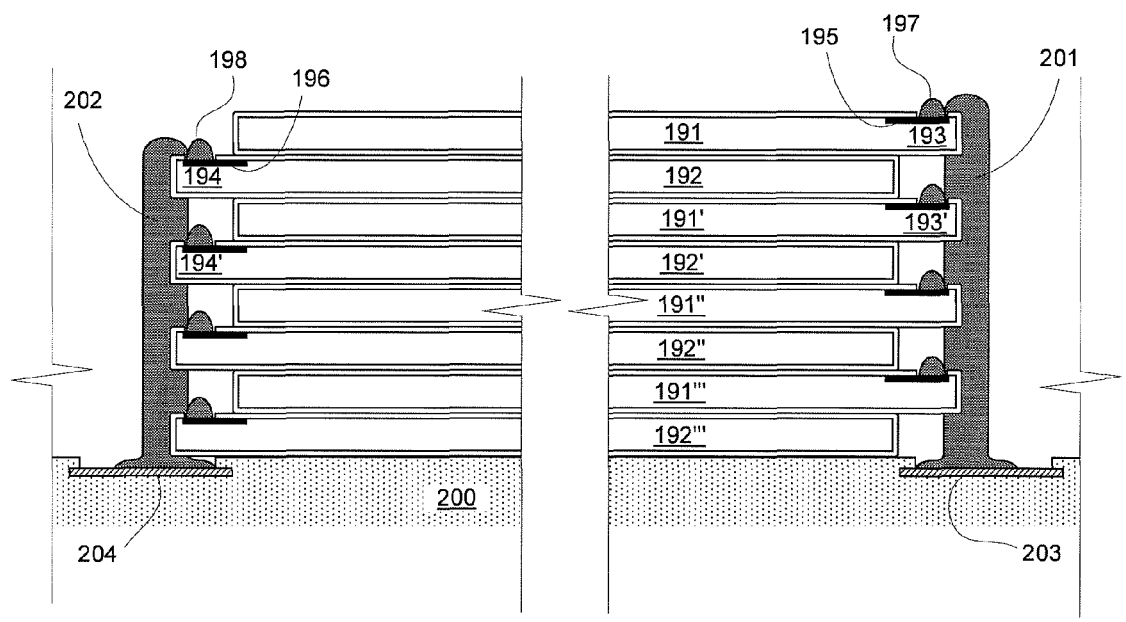

Referring now to FIG. 19C, die 191 is stacked over die 192 constituting a first (top) die pair. The interconnect margin 193 of die 191 is oriented toward the right in the FIG., and the interconnect margin 194 of die 192 is oriented toward the left. The die are offset so that the interconnect terminals of interconnect margin 194 is exposed. The interconnect terminals 195, 196 are each provided with a glob or knob of conductive material 197, 198, to provide contact access for columns 201, 202 of interconnect material formed at the sides.

As FIG. 19C shows, each interconnect margin 193, 194 of the first pair of die 191, 192 overhang the interconnect margin of the pair of die beneath; thus, interconnect margins 193, 194 of the first pair of die 191, 192 overhang interconnect margins 193', 194' of the next pair of die 191', 192'. The configuration at each set of margins (left or right in the FIG.) is similar to that of the construct shown in FIG. 3B, but in this construct the (even numbered) die 192,192' serve as spacers for the (odd numbered) die 191, 191' (see spacer 37 between two of the die in FIG. 3B). Referring again to FIG. 19C, the stack of die are mounted on a support (here, substrate 200) so that the die edges overlap corresponding interconnect sites 203, 204 in the substrate. After the die stack is mounted on the substrate, interconnect traces 201, 202 are formed, contacting the knobs (e.g., 197, 198) at the die and contacting the sites 203, 204 in the substrate. Accordingly, the interconnect trace 202 provides electrical continuity between site 204 and circuitry on die 192, 192', 192'', 192'''; and the interconnect trace 203 provides electrical continuity between site 203 and circuitry on die 191, 191', 191'', 191'''.

Any of various conductive materials may be suitable as the globs or knobs on the interconnect terminals. The knob may be a metal bump, for example, such as a stud bump formed of gold using a wire bonding tool; or, the knob may be a solder bump, which may be formed as a deposit of a solder paste, for example, which may be formed by printing or dispensing; or, the knob may be metal, formed for example in a plating process; or, the knob may be a deposit of an electrically conductive polymer. Where the knob is a glob of an electrically conductive polymer, the material can include any of the various materials that are suitable for the interconnect trace material itself, and can be formed by, for example, any of the techniques described for forming the interconnect traces, as described above.

Interconnect materials suitable for the traces 201, 202 include, for example, curable conductive polymers such as conductive epoxies. Because the interconnect traces in these embodiments are not externally supported between the interconnect sites on the substrate and the die, or between the spaced-apart die, the interconnect material must be sufficiently firm in the uncured state to maintain the columnar shape and the contact with the knobs or globs. Suitable polymers have a high thixotropic index, usually 6.5 or greater; and a high viscosity, usually 30,000 cps or greater. (The thixotropic index and viscosity must not be so high as to make the material unworkable or so that incursion of the material over the die edge to make contact with the knobs is not possible.) Formation of the columns may be made by a pulse dispense procedure, as described in U.S. application Ser. No. 12/124, 097, (cited above).

As may be appreciated, rotation of one die in each pair in relation to the other results in a non-parallel position of the corresponding interconnect terminals. For instance where there are 32 pads along the margin of the die, die pad #1 in one die is situated opposite die pad #32 in the other die in the pair. This can be resolved by suitable routing of the circuitry in the support. This may call for an additional layer in the substrate, which can significantly increase costs. Alternatively this can be avoided by designing the die so that there are two types (right-handed ones, in which the pads are numbered, for example, #1-#32; and left-handed ones, in which the pads are numbered #32-#1. This requires maintaining an inventory of right- and left-handed die.

Figure 20A:
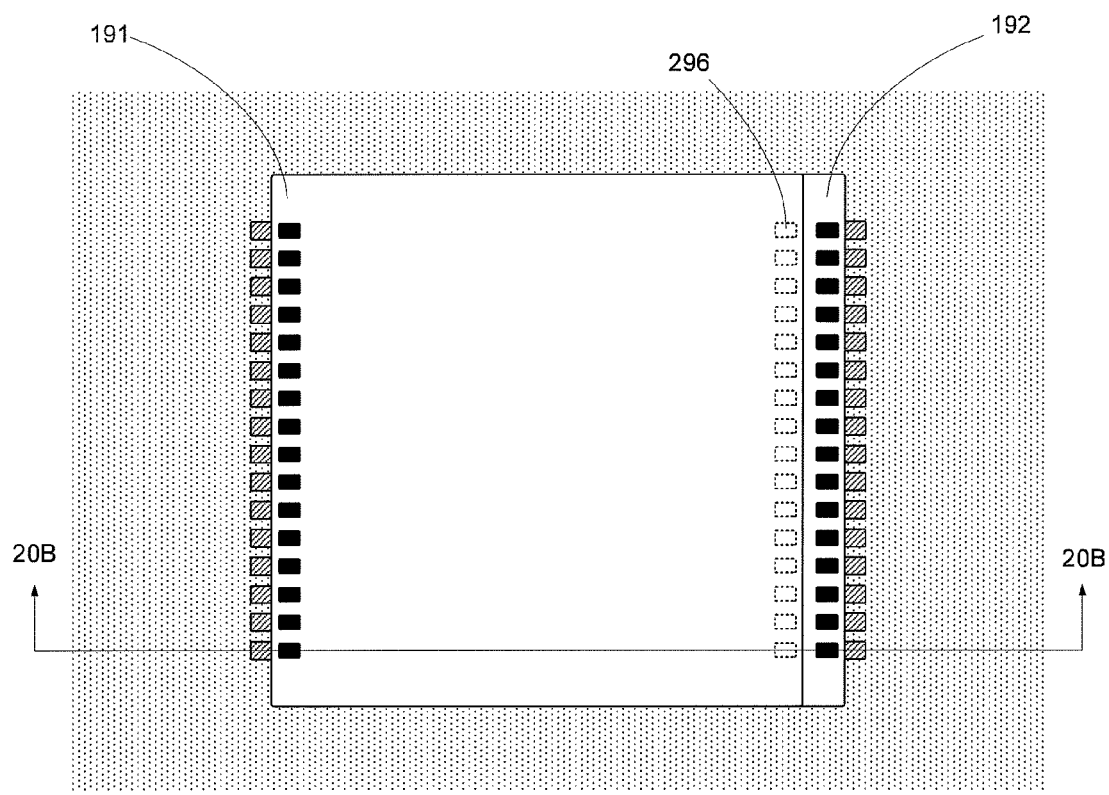
FIG. 20A is a diagrammatic sketch in a plan view showing a stack of die mounted on a substrate, according to another embodiment of the invention.
Figure 20B:
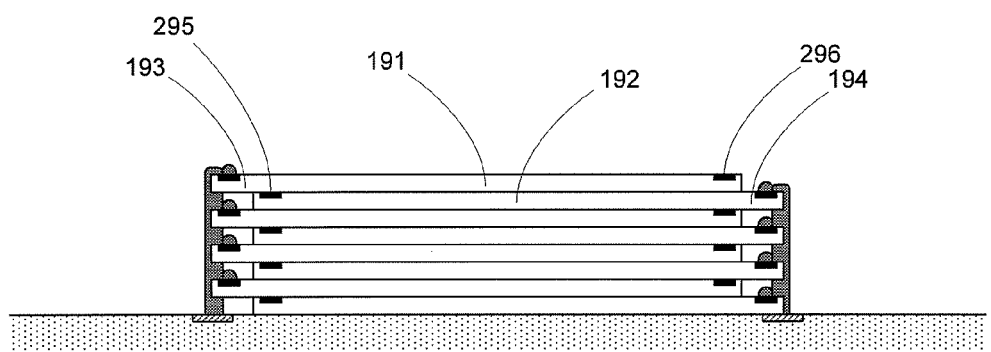
FIG. 20B is a diagrammatic sketch showing another embodiment of an interconnected stacked die assembly in a sectional view as indicated at 20B-20B in FIG. 20A.

As a further alternative, all the die may be designed with a first set of pads (numbered, for example, #1-#32) along one margin and a second set of pads (numbered #32-#1) along the opposite margin. FIGS. 20A, 20B, show such an embodiment. Here the die are constructed generally as shown in FIGS. 19A, 19B, with a second set of pads 295, 296 along the margin opposite the interconnect margin. It is unnecessary to rotate successive die; rather, the die are mounted all in the same orientation, and, following coating, the unneeded sets of pads can be left unexposed.

Figure 21B:
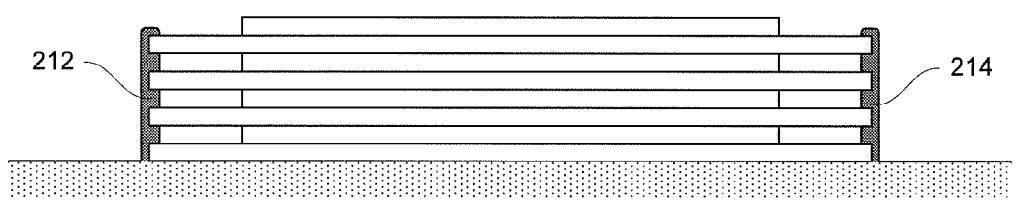
FIG. 21B is a diagrammatic sketch showing another embodiment of an interconnected stacked die assembly in a sectional view as indicated at 21B-21B in FIG. 21A.
Figure 21C:
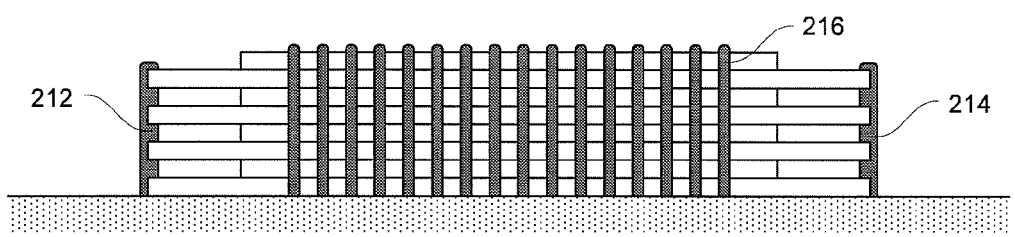

A further stacking arrangement is shown in the embodiment shown in FIGS. 21A, 21B, 21C. Here, the die are longer in an X-direction than in a Y-direction, and the interconnect terminal are situated in the margins along the shorter edges. Successive die in the stack are oriented at right angles to the die stacked over or under. Interconnection is carried out generally as described with reference to FIG. 19C: the interconnect traces are formed as columns 212, 214, and, e.g., 216 connecting the interconnect terminals on the overhanging die, and the die pads are provided with globs or knobs (not shown in these FIGs.) to which the columns make electrical contact. As in the examples shown in FIGS. 19A, 19B, 19C, the even numbered die serve as spacers for the odd numbered die.

Still another embodiment of a stacked die configuration is shown by way of example in FIG. 22. Reference is made to FIG. 5, showing stacked offset die, each die having interconnect terminals arranged in a margin adjacent each of two front die edges having a common die corner. In the example of FIG. 5, successive die are offset to expose the pads (or part of the pads) in the underlying die. Here, as in the staggered die arrangement shown in example of FIGS. 19A, 19B, 19C, pairs of offset die in the stack are mounted one over another so that the respective interconnect edges are vertically aligned. In this example, one die in each pair is oriented at 180° with respect to the other. Interconnection is carried out generally as described with reference to FIG. 19C: the interconnect traces (not shown in this FIG.) are formed as columns connecting the interconnect terminals on the overhanging die, and the die pads are provided with globs or knobs (not shown in these FIGs.) to which the columns make electrical contact. As in the examples shown in FIGS. 19A, 19B, 19C, the even numbered die serve as spacers for the odd numbered die.

As noted above (with reference, for example, to FIG. 17), uncoated die may be stacked and then a coating process may be applied to the stack. Where a parylene is formed using a dry vapor deposition, the active monomer condenses on surfaces within very small spaces and, accordingly, the polymer can form in a very thin space between adjacent die. Such a very thin layer of polymer can suffice to effect adhesion between adjacent die. It may be preferable, when stacking uncoated die and thereafter applying the coating, to provide for uniform space between the adjacent die. This may be accomplished by providing small electrically nonconductive spacers over the surface of each support (die or substrate, for example) and then placing the next die in the stack upon the spacers. Stages in such a process are shown by way of example in FIGS. 23A, 23B, 23C. FIG. 23A shows four die 2312, 2312', 2312'', 2312''', selected 2320 for assembly into a four-die stack. Each die except the topmost one in the stack is provided with (in this example) a number of generally spheroidal spacer elements 2314 all having approximately the same nominal height. The material of the spacer elements is electrically nonconductive. When the die are placed one over another to form a stack 2322, as illustrated in FIG. 23B, the spacer elements provide a standoff, or space 2313, between adjacent die, and the height of the spacer elements determines the thickness of the standoff. The spacer elements may have a nominal height in a range about 5 um to about 40 um, for example. The assembly of spaced-apart die is then subjected to a conformal coating process, resulting in a coated stacked die assembly 2324, as shown in FIG. 23C. The coating 2316 forms on all exposed surfaces of the assembly, including a die active side at the "top" of the stack, a die backside at the "bottom" of the stack, and die sidewalls; and including the spaced-apart front sides and back sides of adjacent die in the stack, as indicated at 2317.

In other embodiments the individual die are provided prior to stacking and adhesion with a conformal coating over at least a contact area; the coated die are stacked to form an assembly of coated die; and the assembly of coated die is subjected to a further conformal coating process to encapsulate the stack and, optionally, to effect adhesion of the die in the stack and/or the stack to an additional stack or to a non-die support.

A greater or lesser number of spacer elements may be required to provide adequate support, depending for example upon the flexibility of the die (thinner die may require more support) and upon the height of the stack and the number of die in the stack.

The spacer elements may be, for example, glass or nonconductive polymer spheres; and they may be scattered over the surface of each die. Or, for example, the spacers may be small polymer dots, which may be adhesive to some extent (they may be a polymer adhesive, for example an epoxy) to affix the adjacent die temporarily, so that the die in the stack do not shift during processing steps leading up to the completion of the conformal coating over the stack; and they may be printed (for example screen printed or mask printed) onto the die surface, or dispensed onto the die surface using a needle or nozzle, for example.

As may be appreciated, to obtain adhesion of a die to a support, whether the support be another die, a substrate, a motherboard, or other surface, the coating need be situated only within an area where contact of the surface of the coated die and the surface of the substrate is expected. For example, where the backside of the coated die contacts a surface of the substrate, for adhesion purposes the coating may be only within the die attach area of the die.

Figure 13A:
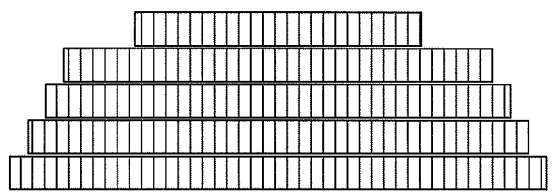
FIGS. 13A-13C are diagrammatic sketches outlining examples of various die stacking arrangements.
Figure 13B:
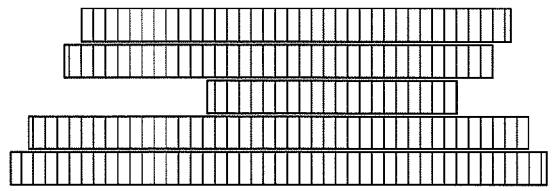
Figure 13C:
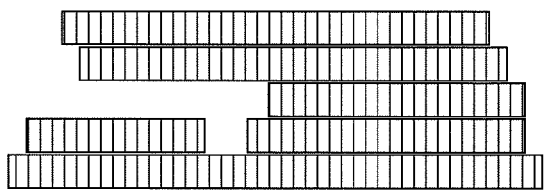

Other embodiments are within the scope of the invention. For example, stacking and interconnection of any of a variety of die (having various functionalities, for example) in any of a variety of configurations may be made. FIGS. 13A through 13C are illustrative of additional stacked die assemblies in which advantages of aspects of the invention may be had.

We claim:

1. A stacked die assembly, comprising a plurality of die stacked one over another, each die having a front side and a back side and sidewalls, wherein adjacent die in the stack are provided with interconnect pads arranged at the front side along a die margin, and wherein the die edge at the margin of a first die is offset in relation to the margin of a second die, and wherein interconnect pads on the die are electrically connected by continuous traces of an electrically conductive material each on a portion of a surface of at least one said die, wherein the electrically conductive material comprises an electrically conductive polymer.

2. The stacked die assembly of claim 1 wherein at least one of the die is provided with an electrical insulation over at least the portions of the die surface on which the conductive traces are situated.

3. The stacked die assembly of claim 1 wherein at least one of the die is provided with an electrically insulative conformal coating over at least the portions of the die surface on which the conductive traces are situated.

4. The stacked die assembly of claim 1 wherein at least one of the die is provided with an electrically insulative conformal coating over at least the front surface and the sidewalls adjacent the die margin on which the interconnect pads are arranged.

5. The stacked die assembly of claim 1 wherein at least one of the die is provided with a single continuous electrically insulative conformal coating over the front surface, the back surface, and the sidewall surfaces of the die.

6. The stacked die assembly of claim 3 wherein the material of the conformal coating includes an organic polymer.

7. The stacked die assembly of claim 6 wherein the organic polymer is a polymer of p-xylene or a derivative thereof.

8. The stacked die assembly of claim 6 wherein the organic polymer is a polyxylylene polymer.

9. The stacked die assembly of claim 6 wherein the organic polymer is a parylene.

10. The stacked die assembly of claim 9 wherein the organic polymer is one of a parylene C, or a parylene N, or a parylene A, or a parylene SR.

11. The stacked die assembly of claim 3 wherein the conformal coating is formed by deposition.

12. The stacked die assembly of claim 11 wherein the conformal coating is formed by vapor deposition.

13. The stacked die assembly of claim 11 wherein the conformal coating is formed by liquid phase deposition.

14. The stacked die assembly of claim 11 wherein the conformal coating is formed by solid phase deposition.

15. The stacked die assembly of claim 1 wherein the interconnect material is a curable conductive epoxy.

16. The stacked die assembly of claim 1 wherein the interconnect material is applied using an application tool.

17. The stacked die assembly of claim 1 wherein the interconnect material is applied using a syringe.

18. The stacked die assembly of claim 1 wherein the interconnect material is applied using a nozzle.

19. The stacked die assembly of claim 1 wherein the interconnect material is applied using a needle.

20. The stacked die assembly of claim 16 wherein the material is extruded from the tool in a continuous flow.

21. The stacked die assembly of claim 16 wherein the material exits the tool dropwise.

22. The stacked die assembly of claim 1 wherein a plurality of the interconnect traces is formed in a single operation.

23. The stacked die assembly of claim 22 wherein the application tool comprises a plurality of needles or nozzles ganged together.

24. The stacked die assembly of claim 1 wherein the interconnect traces are formed by printing.

25. The stacked die assembly of claim 1 wherein the interconnect traces are formed by printing from a print head.

26. The stacked die assembly of claim 1 wherein the interconnect traces are formed by screen printing.

27. The stacked die assembly of claim 1 wherein the interconnect traces are formed by printing through a mask or stencil.

28. A mounted die stack, comprising the stacked die assembly of claim 1 electrically interconnected with circuitry in a device for use.

29. The mounted die stack of claim 28 wherein the stacked die assembly is interconnected such that the active side of the die faces toward the underlying circuitry.

30. The mounted die stack of claim 28 wherein the stacked die assembly is interconnected such that the front side of the die faces toward the underlying circuitry.

31. A stack of die comprising a plurality of die, each die having interconnect pads situated in a margin along at least a first die edge, wherein interconnect pads on a first die are electrically connected by respective traces of an electrically conductive polymer or an electrically conductive ink to interconnect pads on a second die, the traces extending continuously between the interconnect pads of the first and second dies and overlying a sidewall of at least one of the first and second dies.

32. The die stack of claim 31, having a stairstep configuration, wherein the first and second dies are adjacent to one another.

33. The die stack of claim 32 wherein the traces are made over the steps.

34. The die stack of claim 31 wherein each die has an X-dimension greater than a Y-dimension, and wherein the first die edge a narrower die edge, wherein succeeding die in the stack are oriented at 90° in relation to vertically adjacent die below or above.

35. The die stack of claim 34 wherein corresponding overlying pads are connected by a vertical interconnect.

36. The stacked die assembly of claim 1 wherein the stack is provided with an electrically insulative conformal coating formed on the die stack.

37. The stacked die assembly of claim 36 wherein the conformal coating is formed in a space between vertically adjacent die, providing adhesion between the die.

38. The stacked assembly of claim 36 wherein the conformal coating is formed over at least the portions of a die surface over which the conductive traces are situated.

* * * * *